(12) United States Patent
Tatsumi

(10) Patent No.: US 6,790,741 B1
(45) Date of Patent: Sep. 14, 2004

(54) PROCESS FOR PRODUCING A SEMICONDUCTOR DEVICE

(75) Inventor: Toru Tatsumi, Tokyo (JP)

(73) Assignee: NEC Corporation (JP)

( * ) Notice: Subject to any disclaimer, the term of this patent is extended or adjusted under 35 U.S.C. 154(b) by 6 days.

(21) Appl. No.: 09/694,919

(22) Filed: Oct. 24, 2000

(30) Foreign Application Priority Data

Oct. 25, 1999 (JP) ............................................. 11-302207

(51) Int. Cl.[7] ......................................... H01L 21/8242
(52) U.S. Cl. ....................... 438/393; 438/240; 438/250; 438/396
(58) Field of Search ................................ 438/396, 253, 438/926, 239, 240, 250, 393

(56) References Cited

U.S. PATENT DOCUMENTS

| | | | | |
|---|---|---|---|---|
| 5,879,982 A | * | 3/1999 | Park et al. ................... | 438/240 |
| 5,972,748 A | * | 10/1999 | Itoh et al. .................... | 438/253 |
| 6,229,166 B1 | * | 5/2001 | Kim et al. .................... | 257/295 |
| 6,262,446 B1 | * | 7/2001 | Koo et al. ................... | 438/239 |
| 6,333,066 B1 | * | 12/2001 | Kim ......................... | 427/126.3 |
| 2001/0039086 A1 | * | 11/2001 | Sato ........................... | 438/241 |
| 2003/0104674 A1 | * | 6/2003 | Kasai ......................... | 438/396 |
| 2003/0175425 A1 | * | 9/2003 | Tatsumi .................. | 427/255.28 |

FOREIGN PATENT DOCUMENTS

| | | | | |
|---|---|---|---|---|
| EP | 1-096555 A2 | * | 5/2001 | ......... H01L/21/316 |
| JP | 08-222709 | * | 8/1996 | ....... H01L/21/8242 |
| JP | 09-321248 | * | 12/1997 | ......... H01L/27/108 |
| JP | 11-054718 | | 2/1999 | ........... H01L/27/10 |
| JP | 11-126883 | | 5/1999 | ......... H01L/27/108 |
| JP | 11-135736 | | 5/1999 | ........... H01L/27/10 |

OTHER PUBLICATIONS

M. Shimizu et al., Refinement of Pb(Zr,Ti)O3 Thin Films Grown by MOCVD. IEEE 1998, pp. 139–142.*
J.F. Roeder et al., Dielectric and Pyroelectric Properties of Thin Film PZT. IEEE 1998, pp. 217–220.*
H. Itoh et al., MOCVD for PZT Thin Film by Using Novel Metaorganic Sources. IEDM 1991, pp. 831–834.*
T. Shiosaki et al., Comparison of the Properties of Pb(Zr, Ti)O3 Thin Films Obtained by MOCVD Using Different Source Materials. IEEE 1995, pp. 303–308.*

* cited by examiner

*Primary Examiner*—Wael Fahmy
*Assistant Examiner*—Anh Duy Mai
(74) *Attorney, Agent, or Firm*—Hayes Soloway P.C.

(57) ABSTRACT

In forming a metal oxide dielectric film of perovskite type for capacitor, an array of lower electrodes and a crystallization-assisting conductive film are simultaneously formed. The crystallization-assisting conductive film is formed outside the lower electrode array, at a distance of about 10 μm or less from the outermost lower electrodes, in a width of 20 μm or more. Then, a metal oxide dielectric film is formed thereon. Since the crystallization-assisting conductive film assists the crystallization of metal oxide dielectric film, capacitor elements which are superior in properties and reliability even when the capacitor elements are produced in a fine structure is obtained.

59 Claims, 17 Drawing Sheets when lower electrode and other wafer surface have Pt when only lower electrode have Pt

PROCESS FOR PRODUCING A SEMICONDUCTOR DEVICE

BACKGROUND OF THE INVENTION

1. Field of the Invention

The present invention relates to a semiconductor device having capacitor elements, as well as to a process for producing the device. More particularly, the present invention relates to the structure of a high-dielectric-constant film or a ferroelectric film, both usable in capacitors of semiconductor integrated circuit and obtained by using organometal gases as the raw material, as well as to a method for forming such a film.

2. Description of the Prior Art

Active research and developments have been made in recent years on ferroelectric memories using ferroelectric capacitors, dynamic random access memories (DRAMs) using high-dielectric-constant capacitors, etc. These ferroelectric memories and DRAMs contain selective transistors, and each capacitor connected to one diffusion layer of each selective transistor functions as a memory cell and stores information. Ferroelectric capacitors use, as the capacitive insulating film, a ferroelectric film composed of $Pb(Zr,Ti)O_3$ (hereinafter referred to as PZT) or the like, and can store non-volatile information by polarizing the ferroelectric film. Meanwhile, high-dielectric-constant capacitors use, as the capacitive insulating film, a high dielectric-constant thin film composed of $(Ba,Sr)TiO_3$ (hereinafter referred to as BST) or the like, and accordingly can show a high capacitance and can be produced in a fine structure. When such a ceramic material is used in semiconductor capacitors, it is highly important that the ceramic material deposited on a lower electrode is divided electrically in order to obtain fine capacitors.

As the method for forming a thin ceramic film by deposition, there have been reported a sol-gel method, a sputtering method and a CVD method.

In the sol-gel method, organometal materials dissolved in an organic solvent are coated on a wafer having lower electrodes formed thereon, by spin coating, and the coated materials are subjected to crystallization by annealing in oxygen. In the method, the temperature needed for crystallization is very high because the crystallization takes place in a solid phase; and in the case of PZT, the crystallization temperature necessary for] achieving sufficient ferroelectric properties is 600° C. and, in the case of BST, the crystallization temperature for achieving sufficient high dielectric-constant properties is 650° C. In the above method, there is a problem that the orientation of the crystals formed is non-uniform. Furthermore, the sol-gel method is difficult to apply to wafers of large diameter because it is inferior in coatability on surface of different levels, and is not suitable for high integration of device.

In the sputtering method, reactive sputtering is conducted using a sintered ceramic target of the same material as the film to be formed and an $(Ar+O_2)$ plasma. A film is formed on a wafer having electrodes, and then the film is subjected to crystallization by annealing in oxygen. A uniform film is obtained by using a large-diameter target and a sufficient film formation rate is obtained by using a large power for plasma generation. In the sputtering method as well, however, a high temperature is needed for crystallization; in the case of PZT, the crystallization temperature for achieving sufficient ferroelectric properties is 600° C. and, in the case of BST, the crystallization temperature for achieving sufficient high-ielectric constant properties is 650° C. Further in the sputtering method, since the composition of the film obtained is decided substantially by the composition of the target used, a change in film composition requires a change of target, which is disadvantageous from the operational standpoint.

In the CVD method, a raw material mixture of gaseous state is transferred into a vessel accommodating a heated substrate to form a film therein. The CVD method is superior in film uniformity on large-diameter wafer as well as in coatability onto surface of different levels, and is considered to be promising as a technique enabling mass production of ULSI. The metals constituting the ceramic film formed include Ba, Sr, Bi, Pb, Ti, Zr, Ta, La, etc.; however, the hydrides or chlorides thereof appropriate for use as raw materials of CVD are very few in kind and, therefore, organometals of such metals are used in the CVD. These organometals, however, have low vapor pressures and are mostly solid or liquid at room temperature and are transferred by using a carrier gas.

In conducting such transfer, however, it is difficult to quantify the flow amount of organometal gases in carrier gas and accurately control the flow amount of organometal gases. It is because the carrier gas contains organometal gases in an amount larger than the amount corresponding to the saturated vapor pressure determined by the temperature of the raw material tank and because the flow amount of organometal gases is influenced not only by the flow amount of carrier gas but also by the surface area of solid raw materials, the temperature of raw material tank, etc. According to the description on the formation of a film of PTO (lead titanate, $PbTiO_3$) by CVD, in Jpn. J. Appl. Phys. Vol. 32 (1993) p. 4175, the temperature of formation of PTO film is very high (570° C.) and the crystal orientation in film is not uniform.

In conventional production of ferroelectric memories or DRAMs, the dielectric film of capacitor has been formed by the above-mentioned methods. In these methods, however, the heating at high temperature such as about 600° C. or more in oxygen atmosphere is essential and the control of crystal orientation has been difficult.

Description is made on the structure of semiconductor device. In order to allow each ferroelectric capacitor or high-dielectric-constant capacitor of semiconductor device to function appropriately, it is necessary that either electrode of the capacitor is electrically connected to the diffusion layer of selective transistor. Conventional DRAMs have generally employed such a capacitor structure that a polysilicon connected to one diffusion layer of selective transistor is used as a electrode and a thin capacitive insulating film such as $SiO_2$ film, $Si_3N_4$ film or the like is formed on the polysilicon. However, since the above thin ceramic film is an oxide, the polysilicon is oxidized when the film is formed directly on the polysilicon, and it is impossible to form a good ceramic thin film. Hence, p. 123 of 1995 Symposium on VLSI Technology Digest of Technical Papers describes a cell structure in which the upper electrode of capacitor and the diffusion layer are connected by local wiring of a metal such as Al or the like. Further, p. 843 of International Electron Devices Meeting Technical Digest, 1994 describes a technique of forming a PZT insulating film on a polysilicon using a TiN barrier metal with respect to DRAM, for example, p. 831 of International Electron Devices Meeting Technical Digest, 1994 describes a technique of forming a STO (strontinum titanate, $SrTiO_3$) thin film as an insulating film on a $RuO_2/TiN$ lower electrode formed on a polysilicon plug, to form a capacitor.

In developing a fine capacitor structure, conventional methods for producing a ferroelectric film or a high-dielectric-constant film have had the above-mentioned problem that a high temperature is required for crystallization of insulating film and a problem associated with etching, described below.

High-dielectric-constant or ferroelectric capacitors have hitherto been produced as follows. First, as shown in FIG. 17(A), element-isolating regions 111, source/drain regions 112, gate electrodes 113, etc. are formed on a semiconductor substrate 110. Then, as shown in FIG. 17(B), an inter-layer insulating film 114 is formed by deposition and metal plugs 115 are formed, after which a lower electrode film 101, a capacitive insulating film 102 and an upper electrode film 103 are formed in this order. Thereafter, dry etching is conducted from the upper electrode film to the lower electrode film to form capacitors separated from each other.

As the material for the lower electrode of high-dielectric-constant or ferroelectric capacitor, a noble metal (e.g. Pt, Ir or Ru) or an oxide thereof is used in many cases. The etching of the lower electrode film is generally conducted by milling because the above material is difficult to etch by reactive etching. The etching of the lower electrode film is conducted in a state that the end of the capacitive insulating film 102 is exposed. If, after the steps up to FIG. 17(B), etching is conducted in a vertical direction, the etching residue of lower electrode film appears owing to milling, during the etching of the lower electrode film; this etching residue adheres to the exposed end of the capacitive insulating film 102. It is pointed out that this adhesion causes the short-circuiting of capacitor.

Hence, in order to prevent the short-circuiting of capacitor, the etching after the steps up to FIG. 17(B) is generally conducted by, as shown in FIG. 17(C), etching the end of the capacitive insulating film by sputtering, so that the capacitors after etching has a tapered surface 104. In this etching, however, the capacitive insulating film inevitably has a large etching damage at the end thereof. As the capacitive area is smaller (the capacitor is finer), the ratio of the damaged area to the total capacitive area is larger; therefore, the deterioration of capacitance due to etching becomes a serious problem. The etching into a tapered side surface is not suitable for production of small capacitors.

Hence, the present applicant proposed, in Japanese Patent Application No. 11-053239, a process for production of capacitor, which comprises first etching a lower electrode film 105 to form lower electrodes of desired shape, as shown in FIG. 18(A), and then, as shown in FIG. 18(B), forming a capacitive insulating film 106 and an upper electrode film 107, followed by etching only the upper electrode film to form upper electrodes of desired shape. In such a capacitor structure, the etching of the end of the capacitive insulating film 106, such as shown in FIG. 17(C), is unnecessary and the above-mentioned etching damage at the end of the capacitive insulating film can be prevented. Further, the upper electrodes can be formed as a plate wiring; therefore, it is unnecessary to form a plate wiring on each upper electrode as done in conventional capacitors, and a reduction in production cost is made possible. Furthermore, the deterioration of ferroelectric film appearing during the formation of plate wiring can be minimized. Moreover, no tapering is necessary during etching, and the process is suitable for production of fine capacitors.

In this process as well, however, a high crystallization temperature of 600° C. or more is necessary as long as the capacitive insulating film is formed by the sol-gel method or by the sputtering method. Use of such a high temperature results in a reaction, at the exposed portion of silicon oxide film where no capacitor is formed, between the metal constituting the capacitive insulating film and the silicon oxide film. This incurs insufficient insulation between lower electrodes separated from each other. Further, the metal diffuses through the silicon oxide film, which significantly deteriorates the properties of the transistors formed below.

Meanwhile, the present inventor proposed a method where no high crystallization temperature is required, i.e. in Japanese Patent Application No. 10-219184 (not yet laid-open at the filing of the present application), a CVD method for forming a metal oxide dielectric film at a temperature of 450° C. or less. With this method, the reaction between the film metal and the exposed portion of silicon oxide film can be prevented and the above-mentioned problem can be solved.

After further investigation, however, the present inventor learned that when lower electrodes of desired shape are formed on a silicon oxide film and then a capacitive insulating film is formed thereon by CVD using organometal raw materials, there appear some cases where no crystallization takes place on each of the finely separated lower electrodes in a portion of areas of capacitive insulating film. A ceramic insulating film shows excellent properties such as high dielectric constant, ferroelectricity and the like only when crystallized; therefore, unless crystallization takes place, no sufficient capacitance or spontaneous polarization is obtained on fine capacitor electrodes.

SUMMARY OF THE INVENTION

To further improve the above technique, the present invention aims at providing a semiconductor device having capacitor elements which are superior in properties and reliability even when the capacitor elements are produced in a fine structure.

The present invention also aims at providing a semiconductor device having capacitor elements superior in noise resistance.

The present invention also aims at providing a process for producing a semiconductor device having capacitor elements which are superior in properties and reliability even when the capacitor elements are produced in a fine structure, by reliably conducting the crystallization of the metal oxide dielectric film of capacitor particularly into a perovskite type crystal at a low temperature.

The present invention also aims at providing a process for producing a semiconductor device having capacitor elements superior in noise resistance.

Accordingly, the present invention is directed to a semiconductor device comprising an array of a plurality of capacitor elements which are each a laminate of a lower electrode, a metal oxide dielectric film of a perovskite type crystal represented by $ABO_3$ and an upper electrode in this order on a semiconductor substrate;

the semiconductor device comprising a crystallization-assisting conductive film made of a material capable of catalyzing the formation of active precursors of the metal oxide dielectric film in formation of the metal oxide dielectric film; the crystallization-assisting conductive film being formed outside the array at a distance not larger than the diffusion distance of active precursor from the outermost lower electrodes in the capacitor array, and in a width at least equal to the width enabling formation of the crystal nuclei of the metal oxide dielectric film.

The present invention is also directed to a semiconductor device comprising an array of a plurality of capacitor elements which are each a laminate of a lower electrode, a metal oxide dielectric film of a perovskite type crystal represented by $ABO_3$ and an upper electrode in this order on a semiconductor substrate;

the semiconductor device comprising a crystallization-assisting conductive film made of a material capable of catalyzing the formation of active precursors of the metal oxide dielectric film in formation of the metal oxide dielectric film; the crystallization-assisting conductive film covering at least 10% of the area of the semiconductor device.

In the present invention, the crystallization-assisting conductive film and the lower electrodes may be formed on the surface(s) of the same or different heights.

In each of the above cases, the crystallization-assisting conductive film is preferably formed on a surface which is exposed right before the formation of the metal oxide dielectric film.

The present invention is further directed to a process for producing a semiconductor device comprising an array of a plurality of capacitor elements which are each a laminate of a lower electrode, a metal oxide dielectric film of a perovskite type crystal represented by $ABO_3$ and an upper electrode in this order on a semiconductor substrate; the process comprising steps of:

forming the lower electrodes and a crystallization-assisting conductive film on an insulating film; both films being independently made of conductive material, where the crystallization-assisting conductive film being a material capable of catalyzing the formation of active precursors of the metal oxide dielectric film in formation of the metal oxide dielectric film; the crystallization-assisting conductive film being formed outside the capacitor array area at a distance not larger than the diffusion distance of active precursor from the outermost lower electrodes of the array, in a width at least equal to the width enabling formation of the crystal nuclei of the metal oxide dielectric film; and forming the metal oxide dielectric film on the formed lower electrodes and the formed crystallization-assisting conductive film.

Yet another aspect of the present invention is directed to a process for producing a semiconductor device comprising an array of a plurality of capacitor elements which are each a laminate of a lower electrode, a metal oxide dielectric film of a perovskite type crystal represented by $ABO_3$ and an upper electrode in this order on a semiconductor substrate; the process comprising a step of:

forming, on an insulating film on which the lower electrodes are to be formed, a crystallization-assisting conductive film so as to cover at least 10% of the area of the semiconductor device; the crystallization-assisting conductive film being made of a material capable of catalyzing the formation of active precursors of the metal oxide dielectric film in formation of the metal oxide dielectric film.

In the process of the present invention, it is preferred that one conductive material is used for formation of the crystallization-assisting conductive film and the lower electrodes, a film of the conductive material is formed on the insulating film, and the film is etched to simultaneously form the lower electrodes and the crystallinity-assisting conductive film in respective patterns.

Also in the process of the present invention, it is preferred that the formation of the metal oxide dielectric film is conducted under first conditions which are initial conditions and then under second conditions which are subsequent conditions and the two conditions are different from each other.

In one method for practicing the above formation of the metal oxide dielectric film, under the first conditions for film formation, all kinds of the organometal material gases to become a material of the metal oxide dielectric film are used and an initial nuclei or initial layer of a perovskite type crystal structure is formed on the lower electrodes and the crystallization-assisting conductive film and, under the second conditions for film formation, the perovskite type crystal structure is allowed to grow on the initial nuclei or initial layer.

In other method for practicing the formation of the metal oxide dielectric film, under the first conditions for film formation, only some kinds of the organometal material gases to become a material of the metal oxide dielectric film are used and an initial nuclei or initial layer of a perovskite type crystal structure is formed on the conductive material and, under the second conditions for film formation, the perovskite type crystal structure is allowed to grow on the initial nuclei or initial layer.

In these Figs, the numerals means as follows.

101: Lower electrode, 102: Capacitive insulating film 103: Upper electrode, 104: tapered surface, 105: Lower electrode, 106: Capacitive insulating film, 107: Upper electrode, 110: Semiconductor substrate, 111: Region for element isolation, 112: Source/drain region, 113: Gate electrode, 114: Inter-layer insulating film, 115: Metal plug, 301: Wafer, 302: Chip, 303: Array area, 304: Lower electrode, 305: Crystallization-assisting conductive film, 401: Hole for quartz pin, 402: Quartz pin, 403: Susceptor, 405: Heater chamber, 406: Vacuum chamber, 407: Turbo molecular pump, 408: Turbo molecular pump, 409: Heating mechanism, 410: Main exhaust gas line, 411: Subsidiary exhaust gas line, 412: Main gate valve, 413: Valve, 414: Water cooling type trap, 415: Valve capable of controlling conductance, 416: Heater, 417: Wafer, 418: Pipes for material feeding, 501: Cylinder, 502: Valve, 503: Flange, 504: Mass flowcontroller, 505: Stopvalve, 506: Stop valve, 507: Stop valve, 508: Vacuum pump, 509: Water cooling type trap, 510:Vacuummeter, 512:Pump, 600:Siliconsubstrate, 601: Gate oxide film, 602: Gate polysilicon, 603: Side wall oxide film, 604: Gate, 605: Diffusion layer, 606: Oxide film for isolation, 607: First inter-layer insulating film, 608: Tungsten plug, 609: Ti film, 610: TiN film, 611: Pt layer, 612: PZT film, 613: IrO$_2$ film, 614: Ir film, 617: Passivation film, 701: First aluminum wiring, 702: Second inter-layer insulating film, 703: Tungsten plug, 704: Second aluminum wiring, 705: Third inter-layer insulating film, 706: Tungsten plug, 707: Ti film, 708: TiN film, 709: Pt film, 710: Crystallization-assisting conductive film, 711: PZT film, 713: IrO$_2$ film, 714: Ir film, 717: Passivation film, 801: Gate oxide film, 802: Gate polysilicon, 804: Gate, 805: Diffusion layer, 806: Oxide film for isolation, 807: First inter-layer insulating film, 808: Wiring groove, 809: Contact hole, 810: Cu wiring, 811: Second inter-layer insulating film, 812: Wiring groove, 813: Through-hole, 814: Third inter-layer insulating film, 815: Plug, 824: Ti film, 825: TiN film, 826: Pt film, 827: PZT film, 828: IrO$_2$ film, 829: Ir film, 830: Passivation film.

DETAILED DESCRIPTION OF THE INVENTION

As previously mentioned, when a plurality of lower electrodes are formed on a silicon oxide film and then a capacitive insulating film is formed thereon by CVD using organometal raw materials, there appear in some cases, on each of the finely separated lower electrodes, areas of capacitive insulating film where no crystallization takes place. The present inventor made a study on the reasons therefor.

Figure 1A:
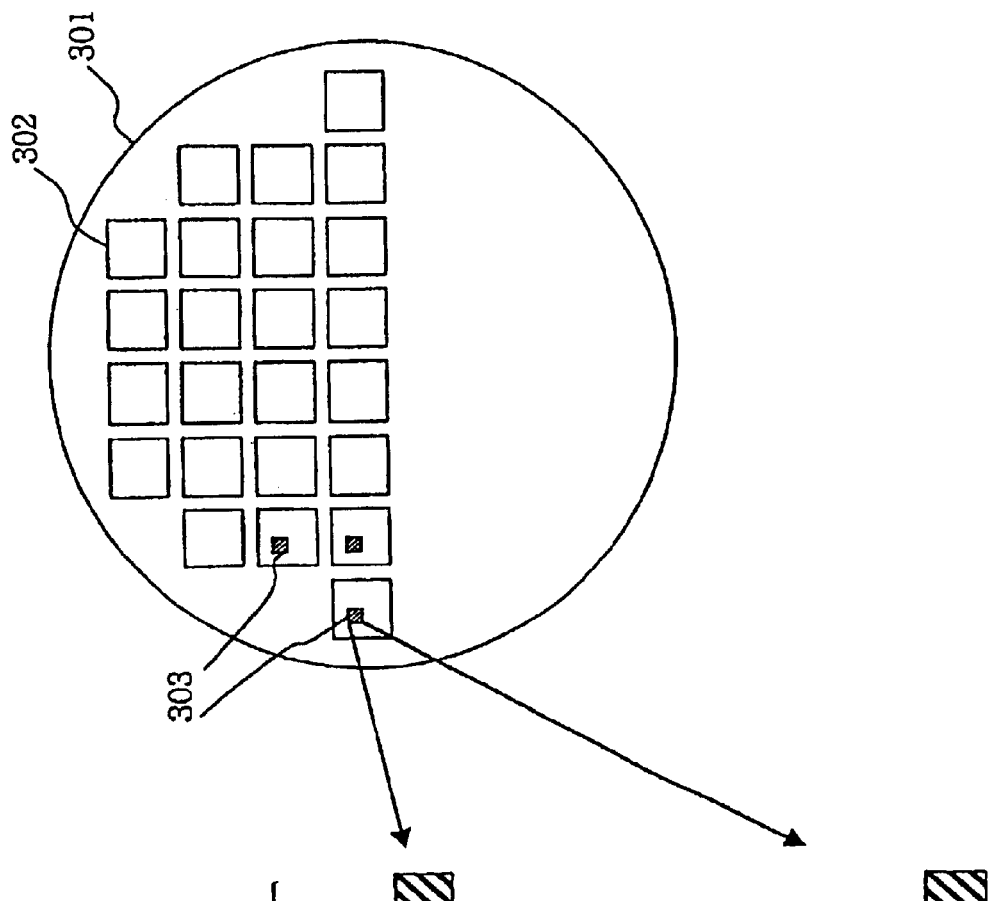
FIG. 1(A) is a schematic view showing chips and lower electrode arrays, both arranged on a wafer.
Figure 1B:
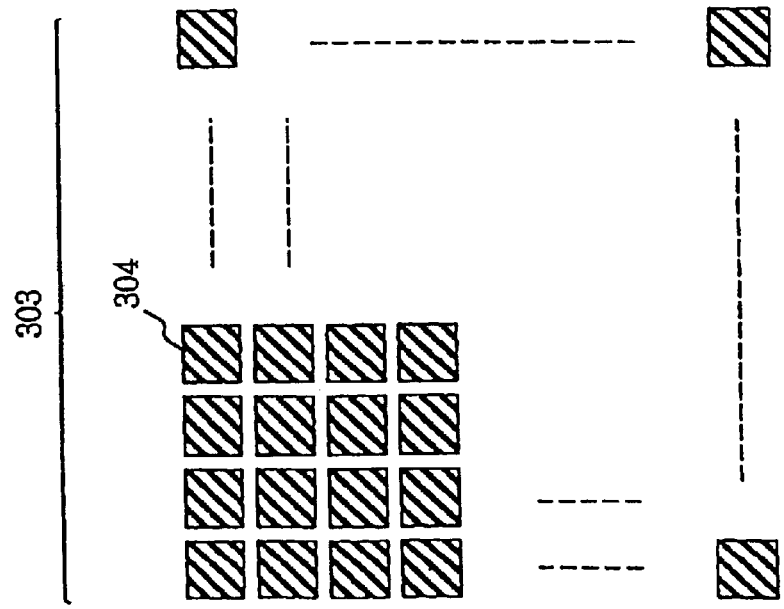
FIG. 1(B) is an enlarged view of the lower electrode array.

FIG. 1 shows a stage in formation of capacitor elements, wherein a lower electrode film made of predetermined materials has been subjected to etching to form lower electrodes in a predetermined pattern. FIG. 1(A) shows a whole wafer, and a number of chips 302 are on a wafer 301. In each chip 302 is a lower electrode array 303 comprising a large number of capacitor elements. FIG. 1(B) is an enlarged view of the lower electrode array 303 and, as shown in FIG. 1(B), the lower electrode array 303 comprises a large number of lower electrodes 304.

In actual electronic devices, the total area of lower electrodes is very small as compared with the total area of chips and is about 1/10 to 1/1,000 of the latter. In a stage where lower electrodes separated from each other have been formed (a stage of FIG. 1), a silicon oxide film (an insulating film) is exposed at the most part of the wafer.

According to the study by the present inventor, when a lower electrode film is formed in a large area using the materials therefor and then a capacitive insulating film is formed thereon, the capacitive insulating film crystallizes easily. On the other hand, when the capacitive insulating film is formed on an insulating film such as silicon oxide film or the like, the crystallization of capacitive insulating film hardly takes place.

In forming a metal oxide dielectric film on lower electrodes by CVD, it is important to form crystal nuclei on the electrodes. When no crystal nuclei are formed in the initial stage of CVD, no crystal growth takes place in the subsequent stage of CVD. In the initial stage of CVD, organometal material gases decompose on lower electrodes. It is considered that the material of the lower electrode functions as a strong catalyst for decomposition of particular organometal gases and promotes the decomposition of such particular organometal gases into active precursors, which contribute to the formation of metal oxide dielectric film. A silicon oxide film does not substantially catalyze the above-mentioned decomposition and the active precursors from particular organometal gases are extremely slight on the silicon oxide film. This is also true when the area of each lower electrode is small, and crystallization of capacitive insulating film is prevented because the ratio of the components necessary for nuclei formation is not obtained on fine lower electrodes. When the surfaces of lower electrodes have been completely covered with a capacitive insulating film, the electrodes does not catalyze any more and the composition of capacitive insulating film is controlled by the efficiency of decomposition of raw material gases on capacitive insulating film. Therefore, when a metal oxide dielectric film is formed on an array of fine lower electrodes, crystallization of the dielectric film proceeds easily on around the center of the lower electrode array. On the other hand, on the electrodes at the periphery of the array, the crystallization hardly takes place.

Figure 2:
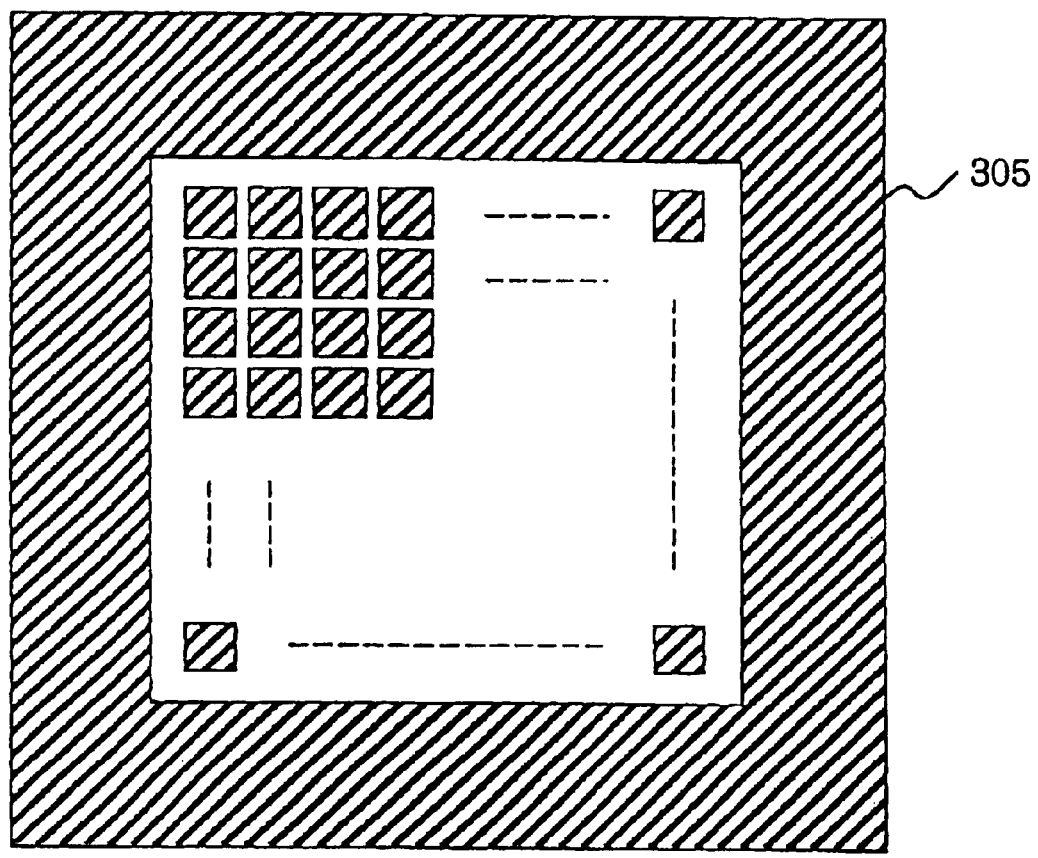
FIG. 2 is a view showing an example of the pattern of a lower electrode array and an example of the pattern of a crystallization-assisting conductive film.

FIG. 2 shows an example of an array of the lower electrodes and the crystallization-assisting conductive film according to the present invention. When, as seen in FIG. 2, a conductive material capable of catalyzing the formation of active precursors of metal oxide dielectric film, similar to the function of the lower electrodes, is arranged as a crystallization-assisting conductive film 305 at the circumference of a lower electrode array 303, crystallization of metal oxide dielectric film proceeds easily even on the lower electrodes at the periphery of the array. The reason therefor is considered to be as follows. Decomposition of raw material gases into active precursors contributing to the formation of metal oxide dielectric film takes place even on the crystallization-assisting conductive film formed just outside the lower electrode array; the active precursors generated diffuse onto the lower electrodes at the periphery of the array; and a metal composition necessary for formation of crystal nuclei is allowed to be present even on the lower electrodes at the periphery of the array.

Figure 3:
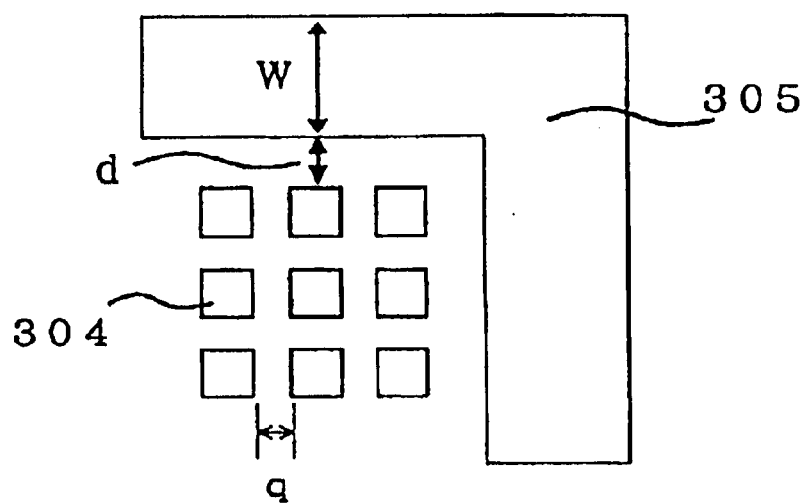
FIG. 3 is a view showing an example of the pattern of a lower electrode array and an example of the pattern of a crystallization-assisting conductive film.

FIG. 3 is an enlarged view of the periphery (upper right corner) of lower electrode array. The distance d from each outermost lower electrode to the crystallization-assisting conductive film 305 is equal to or smaller than the diffusion distance of active precursor of metal oxide dielectric film.

The diffusion distance of active precursor is a distance which active precursors can move for formation of crystal nuclei. When the kinds of the active precursors formed by decomposition of raw material gas catalyzed by crystallization-assisting conductive film are two or more, the diffusion distance of the active precursor of smallest diffusion distance is taken as the diffusion distance of active precursor. If the crystallization-assisting conductive film is formed at a distance beyond the diffusion distance of active precursor from the periphery of lower electrode array, the conductive film shows no intended effect. The diffusion distance of active precursor generally differs depending upon the kinds of raw material gases used, the conditions (pressure and temperature) for film formation, etc. When in the set of experiments the distance d in each experiment is changed gradually from small to larger distance, it is observed that crystallization on lower electrodes close to the periphery of the array does not take place from a certain distance. Therefore, the maximum distance in which crystallization occurs, which can be easily determined by experiment as above, is taken as "the diffusion distance of active precursor". When the pressure for formation of metal oxide dielectric film is high, active precursors are unable to move easily and the diffusion distance of active precursor is generally small; when the above pressure is low, active precursors can move easily and the diffusion distance of active precursor is generally large.

When a Pb-containing oxide dielectric film is formed under the conditions of about $1\times10^{-2}$ to $1\times10$ Pa (pressure) and about 300 to 450° C. (temperature), "the diffusion distance of active precursor" can generally be found in a range of 20 μm or less. Hence, the distance d from each outermost lower electrode to crystallization-assisting conductive film can be appropriately set in a range of preferably less than 10 μM, particularly preferably 8 μm or less, most preferably 5 μm or less.

Meanwhile, the distance d generally has no lower limit when viewed from the standpoint of crystal nuclei formation. The distance d is at least the minimum distance by which the crystallization-assisting conductive film can be electrically insulated and separated from each outermost lower electrode, and is generally be made not smaller than the width separating adjacent two lower electrodes, i.e. q in FIG. 3. Therefore, the distance d from each outermost lower electrode to crystallization-assisting conductive film is appropriately set so as to be ordinarily not smaller than the width q separating adjacent two lower electrodes but smaller than 10 μm, preferably 5 μm or less.

The crystallization-assisting conductive film needs to have an area capable of generating the amount of active precursors required for nuclei formation, and needs to have at least a certain width in a direction proceeding perpendicularly outward from the lower electrode array, i.e. a width enabling formation of initial nuclei (this width is hereinafter referred to as "the width enabling formation of crystal nuclei" and differs depending upon the conditions for formation of metal oxide dielectric film). Therefore, the width W of the crystallinity-assisting conductive film 305 of FIG. 3 must be at least the above width enabling formation of crystal nuclei. When the width W is made gradually smaller, there appear capacitor elements having no crystallized dielectric film, at around the lower electrode array periphery; therefore, the maximum distance enabling crystallization is taken as "the width enabling formation of crystal nuclei", and it can be easily determined by experiment.

When a Pb-containing oxide dielectric film is formed under the same conditions as above, of about $1\times10^{-2}$ to $1\times10$ Pa (pressure) and about 300 to 450° C. (temperature), the width W is ordinarily 15 μm or more, preferably 20 μm or more, more preferably 30 μm or more although it differs slightly depending upon the conditions of film formation. The width W may be 100 μm or more, or even 500 μm or more unless necessity calls for a small W. Further, the crystallinity-assisting conductive film may be formed so as to cover the whole surface of semiconductor device other than the surface portions on which the conductive film must not be formed.

In the present invention, the lower electrodes and the crystallinity-assisting conductive film are formed, in many cases, on a surface of the same height, e.g. on a flat insulating film, as shown in Examples appearing later. However, the lower electrodes and the crystallinity-assisting conductive film may be formed on surfaces of different heights. That is, as long as the distance between each outermost lower electrode and the crystallinity-assisting conductive film is not larger than the diffusion distance of active precursor, the movement (diffusion) of active precursors is not affected even when there is the above-mentioned difference in the surface height. Further, even when the crystallinity-assisting conductive film per se has different surface heights, the conductive film can exhibit an intended effect as long as the requirements of the present invention are met.

Thus, the gist of the present invention lies in that a crystallization-assisting conductive film which may be made of the same material as that of the lower electrodes is formed outside the capacitor array area, within such a distance from the periphery of the capacitor array area that the crystallization of metal oxide dielectric film takes place reliably even on the outermost lower electrodes, in such an area and shape that can give rise to the crystallization of metal oxide dielectric film. Therefore, as long as the above gist is satisfied, the crystallization-assisting conductive film can take various shapes and is not restricted to the shapes shown below and covered by the scope of the present invention. The following examples of the shape of the conductive film are each shown in an enlarged view of the upper right corner of the array.

Figure 4:
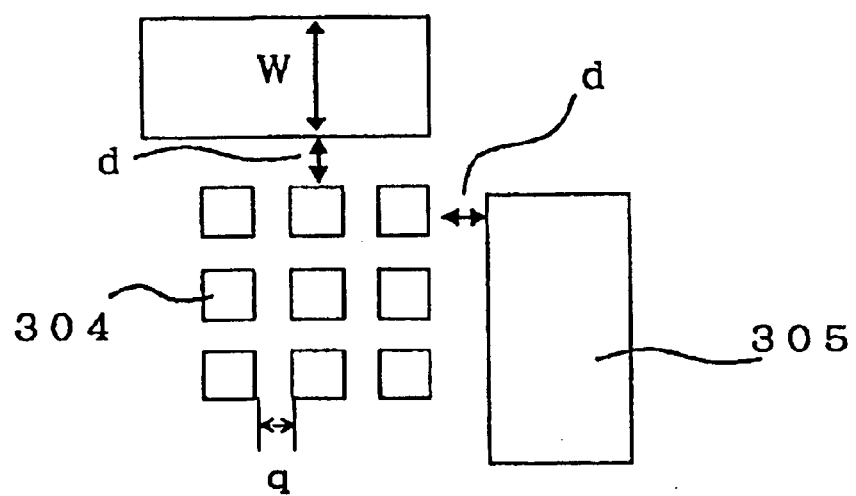
FIG. 4 is a view showing an example of the pattern of a lower electrode array and an example of the pattern of a crystallization-assisting conductive film.

FIG. 4 shows an example of the shapes of lower electrodes and crystallization-assisting conductive film. In this example, the corner portion of crystallization-assisting conductive film is excluded from the view of FIG. 3. Even when the conductive film takes such a shape, crystallization takes place sufficiently even on the lower electrodes of the corner of the array.

Figure 5A:
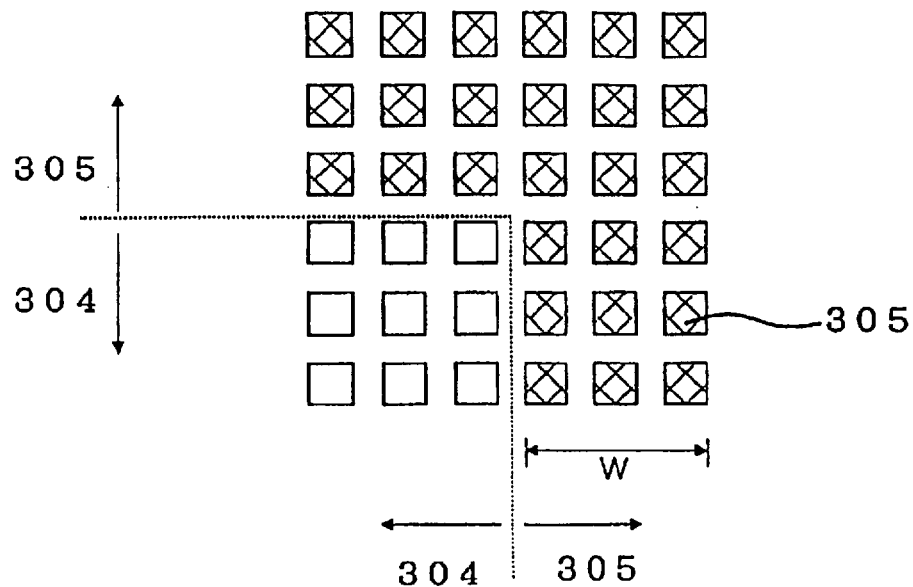
FIGS. 5(A) and 5(B) are views showing an example of the pattern of a lower electrode array and an example of the crystallization-assisting conductive film.

In FIG. 5(A), a crystallization-assisting conductive film 305 (dummy lower electrodes) having the same shape as lower electrodes 304 is formed at the circumference of the lower electrodes. These dummy lower electrodes are not used as capacitor elements. In FIG. 5(A), although three rows (or columns) of the dummy electrodes are shown outside the lower electrode array for the sake of simplicity, and they are formed outside the array area so that the width W of the three rows (or columns) of the dummy electrodes becomes at least the width enabling formation of crystal nuclei. When the crystallization-assisting conductive film is formed outside the lower electrode array, as dummy lower electrodes each of the same shape and pitch as each lower electrode, the lower electrode array and the crystallinity-assisting conductive film (dummy lower electrodes) have the same thermal radiation ratio pattern and thereby the heat distribution in the lower electrode array becomes uniform when the substrate is heated for formation of metal oxide dielectric film. Further, the concentration of active precursors on lower electrode during formation of metal oxide dielectric film becomes uniform in the array. Therefore, the quality and thickness of the metal oxide film formed are very uniform on the lower electrodes of both the center of the array and the periphery of the array.

Figure 5B:
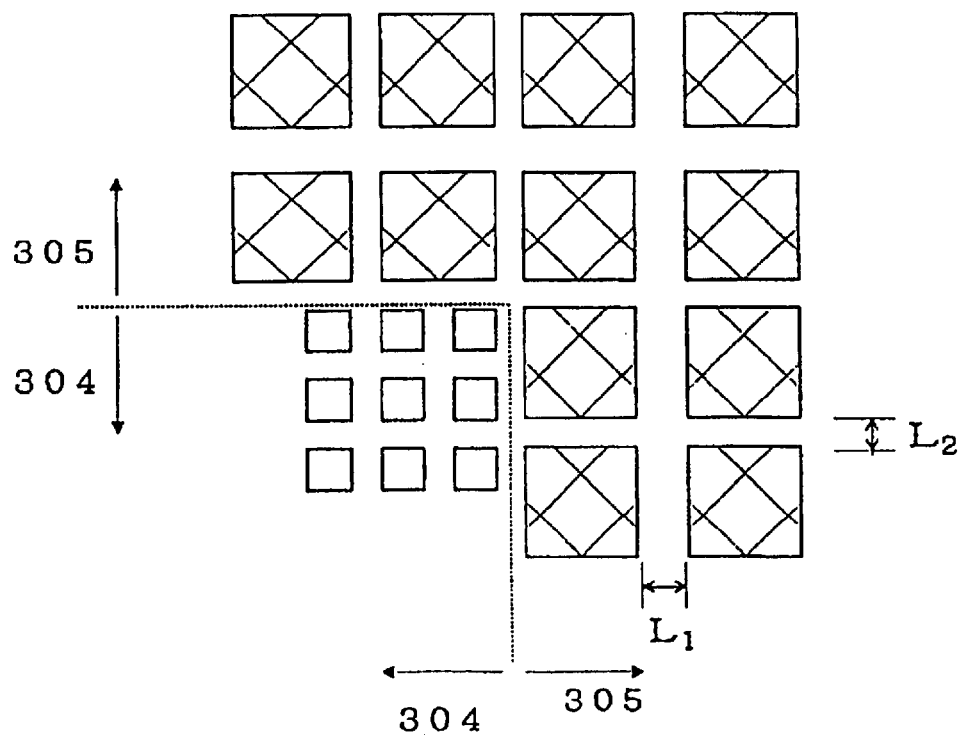

Also, as shown in FIG. 5(B), a crystallinity-assisting conductive film 305 may be formed as a number of dummy lower electrodes each larger than each lower electrode 304. Also, as shown in FIG. 6, a crystallinity-assisting conductive film 305 may be formed so as to have gaps (or holes).

Figure 6:
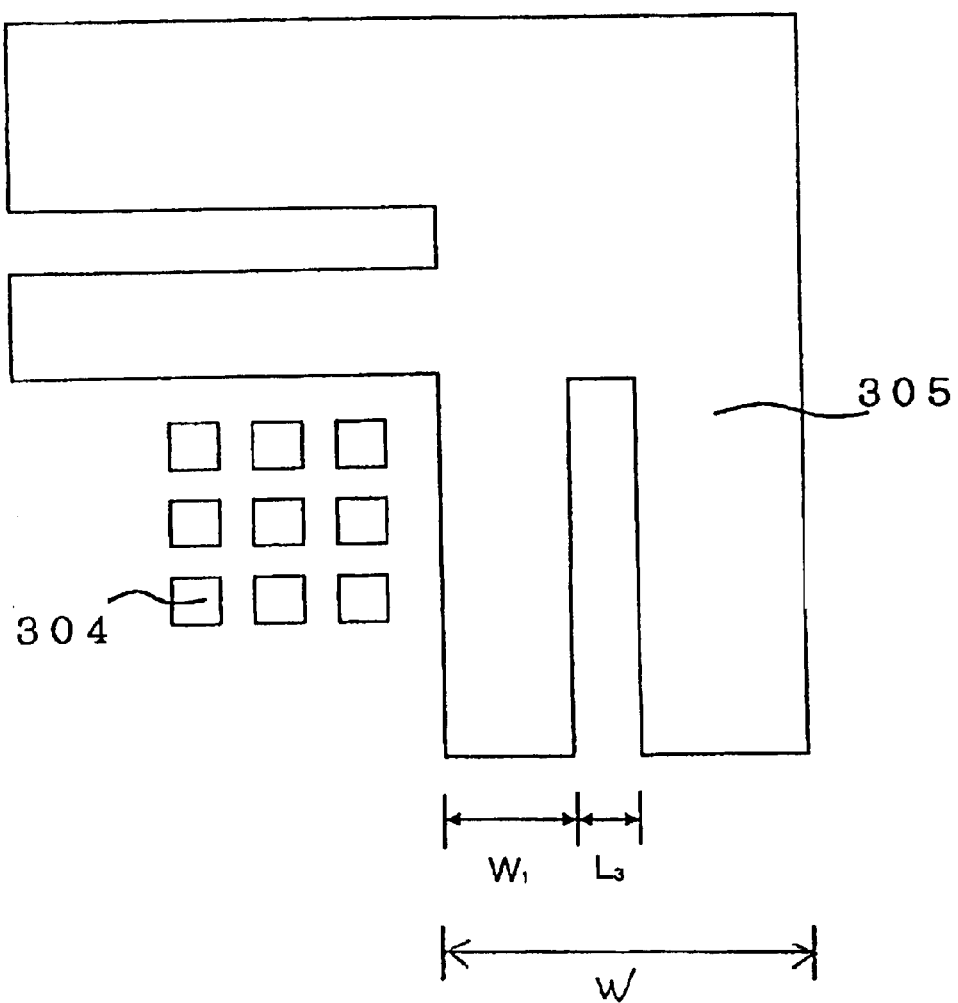
FIG. 6 is a view showing an example of the pattern of a lower electrode array and an example of the pattern of a crystallization-assisting conductive film.

In the present invention, the crystallinity-assisting conductive film may be formed into a plurality of films separated from each other or may have gaps (or holes), as shown in FIGS. 5 and 6. These paration width $L_1$ [FIG. 5(B)] and the gaps $L_3$ (FIG. 6) are preferably not larger than the above-mentioned diffusion distance of active precursor. When the gaps $L_1$ and $L_3$ are larger than the diffusion distance of active precursor, the portion of the crystallinity-assisting conductive film not close to the lower electrode array does not contribute to film formation of metal oxide dielectric film. In this case, when the width W1 of the portion of the crystallinity-assisting conductive film close to the array is at least the same as the width enabling formation of crystal nuclei, crystallization takes place without fail. This is the same as a case when the width of crystallinity-assisting conductive film differs depending upon the location of the conductive film.

When the crystallization-assisting conductive film is at a plurality of locations separated from each other as shown in FIG. 5(B), the distance $L_2$ in FIG. 5(B) needs to be, in the vicinity of the lower electrode array, "a distance not larger than the diffusion distance of active precursor from each outermost lower electrode".

Incidentally, the shape of the lower electrode array is ordinarily an arrangement of square or rectangular lower electrodes in a matrix pattern. However, the shape is not restricted thereto. The shape of the crystallization-assisting conductive film surrounding the lower electrode array can appropriately be determined so as to fit the shape of the lower electrode array, at a distance not larger than the diffusion distance of active precursor from each outermost lower electrode, in a width at least equal to the width enabling formation of the crystal nuclei of metal oxide dielectric film.

The lower electrodes and the crystallization-assisting conductive film are formed on an insulating film such as inter-layer insulating film or the like, and each lower electrode is connected to each contact plug or the like, formed in the insulating film. As the insulating film, there is used, for example, a silicon oxide film, a silicon nitride film or an insulating film used as inter-layer insulating film. The width separating adjacent two lower electrodes can be 0.01 μm or more for sufficient electrical insulation. When this width is too small, malfunction may take place between adjacent capacitors owing to the electrical field inside the dielectric film; therefore, optimum conditions need be selected.

In the present invention, the lower electrodes and the crystallization-assisting conductive film may consist of a single layer or a plurality of layers. In actual semiconductor devices, a plurality of layers are often used for various reasons. In each case, the surface layers of each lower electrode and the crystallization-assisting conductive film, on which a metal oxide dielectric film is to be formed, need to be made of a conductive material capable of acting chemically as a catalyst in CVD using organometal materials. As such a conductive material, there can be mentioned, for example, high-melting metals such as Pt, Ir, Ru, Ti, W and the like, and their oxides, nitrides and the like. Preferred specific examples are Pt, Ir, Ru, $Ir_2O$, $RuO_2$, TiN and WN; more preferred specific examples are Pt, Ir, Ru, $IrO_2$ and $RuO_2$.

When a plurality of layers are employed, the material of the lowermost layer can be selected appropriately. When a Pt/TiN/Ti structure (Ti is the lowermost layer) is employed, TiN functions as a barrier for diffusion of Ti. In this structure, TiN is highly orientated in (111); therefore, Pt is also orientated in (111). When the CVD of the present invention is employed, there are advantages that the metal oxide dielectric film also is orientated easily and its crystallinity is good (which is not expected using conventional methods for film formation). Since W (tungsten) also is ordinarily used as a contact plug, a Pt/TiN/Ti/W structure (W is the lowermost layer) can also be suitably used for the lower electrodes and crystallization-assisting conductive film of the present invention.

In the present invention, the lower electrodes and the crystallization-assisting conductive film may be made of one material or different materials. It is preferred that one material is used for process simplicity, a lower electrode film is formed on an insulating film formed on a semiconductor substrate (the insulating film may have different heights), and then patterning is conducted to simultaneously form lower electrodes and a crystallization-assisting conductive film.

As the metal oxide dielectric of a perovskite type represented by $ABO_3$, used as a capacitive film in the present invention, there can be mentioned, for example, STO [$SrTiO_3$], BTO [$BaTiO_3$], BST [$(Ba,Sr)TiO_3$], PTO [$PbTiO_3$], PLT [$(Pb,La)TiO_3$], PZT [$Pb(Zr,Ti)O_3$], PLZT [$(Pb,La)(Zr,Ti)O_3$], PNbT [$(Pb,Nb)TiO_3$], PNbZT $(Pb,Nb)(Zr,Ti)O_3$, and metal oxides obtained by replacing Zr (if present) in the above metal oxides with at least one kind selected from Hf, Mn and Ni.

Of these metal oxides, preferred are those containing Pb as the element A and particularly preferred are PTO, PLT, PLZT, PNbT, PNbZT and metal oxides obtained by replacing Zr (if present) in the above metal oxides with at least one kind selected from Hf, Mn and Ni.

In the present invention, in order to allow a metal oxide dielectric film having a perovskite type crystal structure represented by $ABO_3$, to grow on crystal nuclei, any film formation method can be used in which the formation of the crystal nuclei is promoted by the crystallization-assisting conductive film. However, a method is preferred in which the first conditions for initial film formation and the second conditions for subsequent film formation are different. That is, it is preferred that, in the present film formation method as compared with the conventional method where film formation is conducted under fixed conditions, the first conditions for forming the initial nuclei or initial layer of perovskite type crystal structure on lower electrodes are allowed to differ from the second conditions for allowing a film of perovskite type crystal structure to grow on the first nuclei formed. The first and second conditions are each selected as optimum. By conducting film formation under such conditions, a thin film can be obtained which is superior in orientation, crystallinity and inversion fatigue. Here, the initial nuclei refers to a state of crystals in which crystal nuclei are present like islands, and the initial layer refers to a state of crystals in which the initial nuclei get together to form a continuous layer. By conducting film formation under appropriate conditions, both the initial nuclei and the initial layer contain good crystal nuclei.

As such a film formation method using the first and second film formation conditions, there can be mentioned, for example, (a) a method wherein, under the first conditions for film formation, all kinds of the organometal material gases to become a material of a metal oxide dielectric film are used and initial nuclei or an initial layer, both of a perovskite type crystal structure is formed on the above-mentioned conductive material and, under the second conditions for film formation, a film of the perovskite type crystal structure is allowed to grow on the initial nuclei or initial layer; and (b) a method wherein, under the first conditions for film formation, only some kinds of the organometal material gases to become a material of a metal oxide dielectric film are used and initial nuclei or an initial layer, both of a perovskite type crystal structure is formed on the conductive material and, under the second conditions for film formation, a film of the perovskite type crystal structure is allowed to grow on the initial nuclei or initial layer.

In general, perovskite type crystal structures are represented by $ABO_3$, wherein the element A occupies the site A and the element B occupies the site B. There are cases that in $ABO_3$, the element A and the element B each contain a plurality of metal elements. When a metal oxide dielectric film having such a perovskite type crystal structure is formed on a conductive material by CVD according to the above-mentioned method (a), initial nuclei or an initial layer (wherein some several molecules have been crystallized in the direction of a film to be formed) of certain perovskite type crystal is formed under the first conditions for film formation, using all kinds of the raw material gases to become the metal oxide dielectric film; then, crystal growth is allowed to proceed on the initial nuclei or the initial layer under the second conditions enabling self-controlling film formation; thereby, a film having a perovskite type crystal structure of uniform orientation can be formed on the conductive material.

Figure 16:
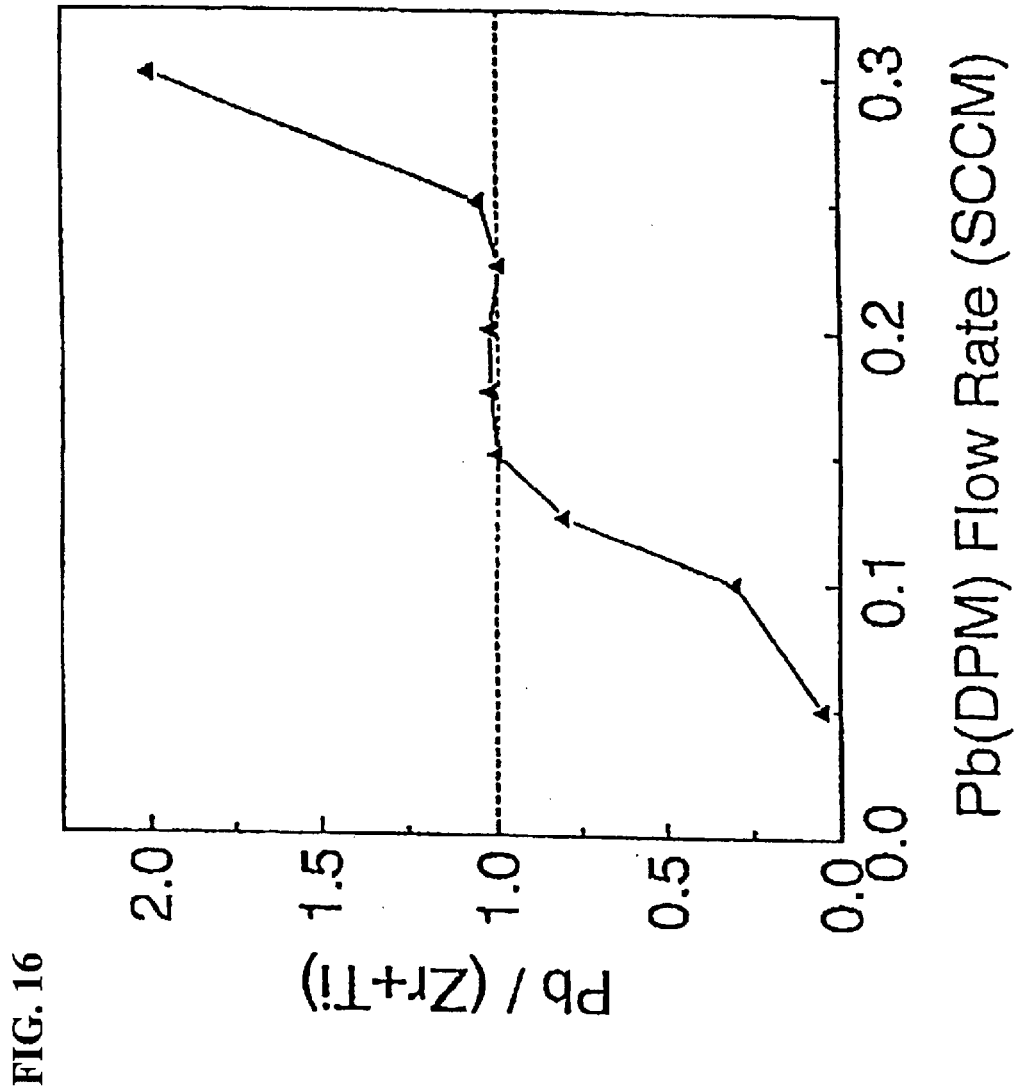
FIG. 16 is a graph showing the change in the (Ti+Zr)/Pb ratio of metal oxide dielectric film when the flow amount of material for Pb has been changed. FIG.
Figure 17A:
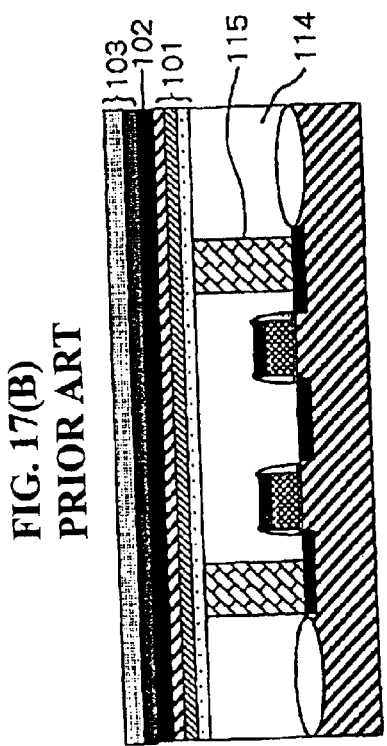
FIGS. 17(A)–(C) are schematic views showing the steps for production of conventional capacitor.
Figure 17B:
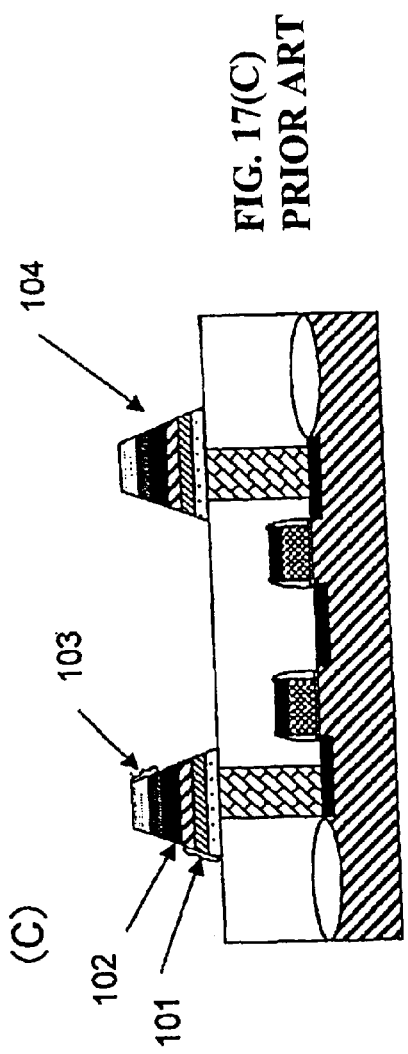
Figure 17C:
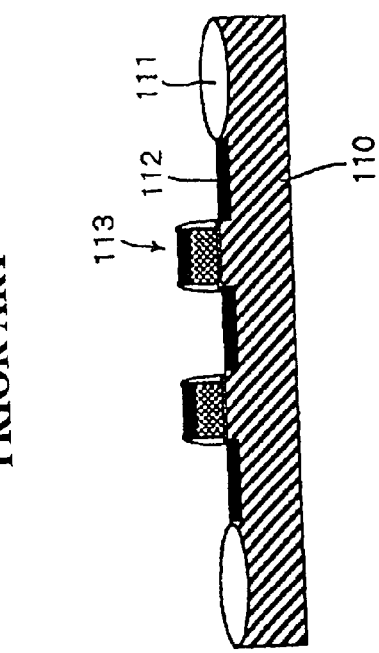
Figure 18A:
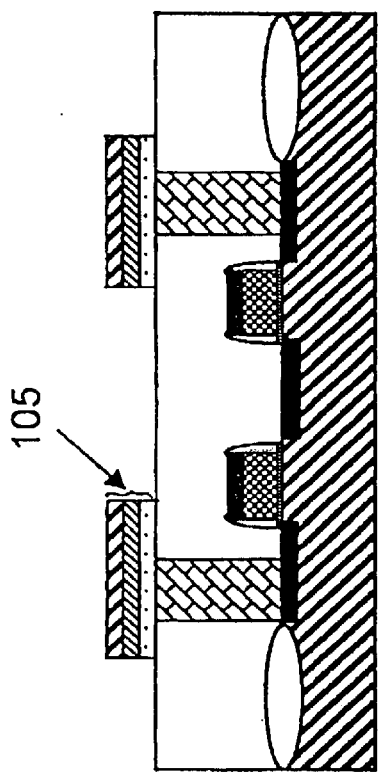
FIGS. 18(A)–(B) are schematic views showing the steps for production of conventional capacitor.
Figure 18B:
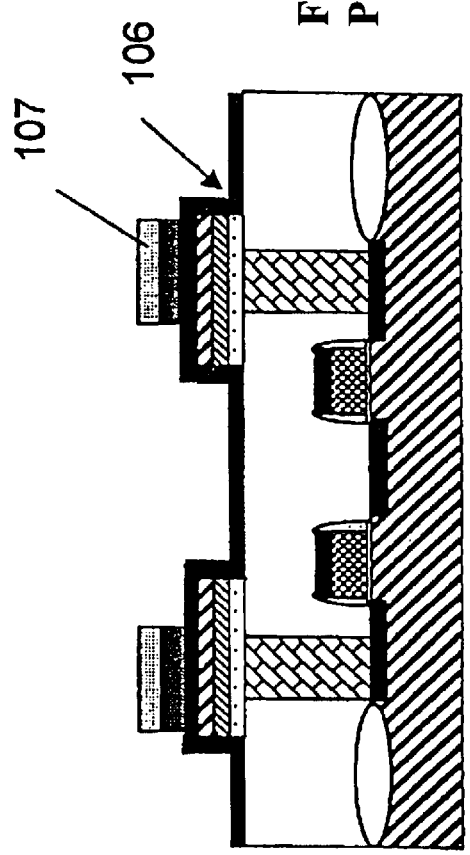

Here, the conditions enabling self-controlling film formation means such raw material gas feeding condition that allows spontaneous formation of a film of a perovskite type crystal structure having a stoichiometric composition and uniform orientation. The conditions enabling self-controlling film formation is explained, with reference to FIG. 16, on, for example, a case of forming a PZT film. Film formation was first conducted for 40 seconds under the conditions of flow amounts of 0.2 SCCM of $Pb(DPM)_2$, 0.05 SCCM of $Zr(OtBu)_4$, 0.25 SCCM of $Ti(OiPr)_4$ and 3.0 SCCM of $NO_2$. Then, the flow amount of the raw material for Pb was changed while the flow amounts of 0.225 SCCM of $Zr(OtBu)_4$, 0.2 SCCM of $Ti(Oipr)_4$ and 3.0 SCCM of $NO_2$ are kept constant. And the change of (Ti+Zr)/Pb in the resulting film was measured. The result is shown in FIG. 16.

In the above film formation, the total gas pressure in the vacuum vessel was $5 \times 10^{-1}$ Pa. As the substrate for PZT film formation, there was used a silicon wafer having thereon a silicon oxide film of 500 nm in thickness and further having thereon a Pt film of 200 nm in thickness formed by sputtering. The time of film formation was 600 seconds, and the film thickness was about 100 nm. The composition of the film was determined by fluorescent X-ray analysis. The composition reaches stoichiometric composition when the flow amount of the raw material for Pb was increased to 0.15 SCCM; the composition of the film remained the same until the flow amount was increased to 0.25 SCCM; and a crystal of perovskite structure having uniform orientation was obtained.

Thus, it is shown that within the range of particular conditions, self-controlling film formation wherein the ratio of A and B sites, i.e. the ratio of Pb and (Zr+Ti) is at stoichiometric ratio (1:1), is possible. This is based on the following mechanism. The Pb-containing organometal material gas is decomposed and oxidized on a PZT surface to become PbO. Since PbO has a low adhesion coefficient to PZT, mere flow of the Pb-containing organometal material gas on the PZT surface gives rise to no film formation. When Ti and Zr are fed together with Pb, the PbO on the PZT surface combines with Ti or Zr before the PbO is released into a gas phase, and is fixed on the PZT surface. Even when the Pb-containing material gas is fed in certain excess, the Pb portion unable to combine with Ti or Zr is released into a gas phase. As a result, a film having a stoichiometric ratio composition is obtained self-controllably (spontaneously) when a raw material gas mixture is fed under particular proportions of raw material gases.

The most important thing in forming a thin metal oxide dielectric film of perovskite type, such as PZT, BST or the like on electrodes of Pt or Ir, is to generate crystal nuclei of perovskite on the electrodes having a crystal structure different from that of the perovskite. Formation of a thin dielectric film of perovskite metal oxide on electrodes proceeds in the following growth mode. That is, first, decomposition of raw material gases takes place on the electrodes; the resulting active precursors are adsorbed; they are combined to form crystal nuclei; the crystal nuclei grow into a layer. In the formation of crystal nuclei, the concentration of each active precursor on electrodes is determined by the decomposition efficiency and adhesion coefficient of each raw material on electrodes and the diffusion of each active precursor into electrodes. Unless the concentrations of active precursors on electrodes are made consistent with the desired composition of a film to be formed, no desired crystal nuclei of perovskite type are generated. The decomposition efficiency and adhesion efficiency of each raw material on electrodes are different from those on PZT crystals; therefore, even if film formation conditions are decided so as to give a film of desired composition, no crystal of desired composition is obtained during the period of formation of initial nuclei on lower electrodes (this period is the most important time of crystal growth) and no desired crystallization takes place.

The present inventor further found out that the element A which occupies the site A, is easily alloyed with the conductive material constituting lower electrodes and consequently diffuses into the electrodes easily. Therefore, in order to prevent the depletion of the element A on the surface of electrodes, it is preferred to feed the element A in an increased amount under the first film formation conditions. The element A can be fed in an amount of up to about 10 times that of the element B under the first film formation conditions as compared with the second film formation conditions which enable self-controlling film formation. When the element A or the element B is composed of a plurality of elements, the amount of the element A or the amount of the element B is decided based on the total of the plurality of elements. For example, in case of a PZT film formation, the first film formation conditions under which the nuclei of PZT are generated on the lower electrodes and the crystallization-assisting conductive film, are optimized so that the fed amount of the raw material for Pb is larger than under the second film formation conditions of forming a PZT film of desired composition spontaneously on the PZT nuclei; thereby, the concentrations of active precursors on electrodes are made consistent with the stoichiometric composition of a film to be formed, crystal nuclei are generated on the electrodes, and good crystals are allowed to grow on the crystal nuclei.

Of the film-constituting elements, Pb (which is an element A) reacts with lower electrodes most easily and disappears from on the electrodes easily. The reaction between Pb and lower electrode is dependent upon the temperature of film formation and the material of electrode and a higher film formation temperature results in higher reactivity between Pb and lower electrode; therefore, the amount of Pb fed under the first film formation conditions for generating PZT nuclei is preferred to be large. Pt as an electrode material has higher reactivity with Pb than Ir or Ru; therefore, when the lower electrodes are made of Pt, the material for Pb needs to be fed in a larger amount. Also when BST nuclei are generated, the material for Ba needs to be fed in a larger amount for the same reason, although the extent of amount increase is not striking as compared with the case of the material for Pb.

The present inventor found out that when the element B is a combination of Zr and Ti, feeding of the material for Zr in a smaller amount than that of the material for Ti can form PZT nuclei of higher crystallinity. This is because the decomposition efficiency of the material for Zr on electrodes is higher than that of the material for Ti.

Next, in the above-mentioned method (b), initial nuclei or an initial layer is formed using only some kinds of the raw material gases for the element A or B, under the first film formation conditions and, under the second film formation conditions, a film is allowed to grow on the initial nuclei or initial layer. In the method (B), the first conditions for generating initial nuclei or an initial layer, each of perovskite can be easily controlled because crystal nuclei of simple composition are formed.

For example, when a PZT film is formed, the first film formation conditions can be easily controlled when the nuclei generated have a simple binary composition of PTO; and when a BST film is formed, the first film formation conditions can be easily controlled when the nuclei generated have a simple binary composition of BTO or STO. The reason is that the control of the nuclei composition is necessary only for two elements. When nuclei formation is conducted as above, the film formation under the second conditions (which enables self-controlling formation of PZT or BST) may be conducted before the formed nuclei grow into an initial layer (that is, in a state where initial nuclei are present), or may be conducted after the formed nuclei has grown into an initial layer. Once crystal nuclei of perovskite type have been formed on lower electrodes, the active precursors generated from raw material gases can give rise to spontaneous crystal growth on the formed crystal nuclei; therefore, by switching to the second film formation conditions, good crystals can be obtained.

By controlling the time required for formation of initial nuclei or initial layer under the first conditions, it is possible to control the grain sizes of crystals of the metal oxide film which grows on the initial nuclei. In order to control the grain sizes of crystals very strictly, it is preferred to form only initial nuclei and not to form an initial layer under the first film formation conditions.

The organometal material gases used in the present invention are those necessary for forming a perovskite type crystal structure represented by $ABO_3$, having a ferroelectric or high-dielectric-constant property. When a PZT film is formed, there can be mentioned, for example, lead bisdipivaloylmethanate [$Pb(DPM)_2$], tetratertiarybutoxyzirconium [$Zr(OtBu)_4$], and tetraisopropoxytitanium[$Ti(OiPr)_4$]. When a BST film is formed, there can be mentioned, for example, barium bisdipivaloylmethanate [$Ba(DPM)_2$], strontium bisdipivaloylmethanate [$Sr(DPM)_2$] and tetraisopropoxytitanium [$Ti(OiPr)_4$].

It is preferred to add, to the organometal material gases, an oxidizing gas in order to prevent the alloy formation on conductive material surface, caused by oxygen shortage and ensure sufficient oxidation. As the oxidizing gas, there can be used nitrogen dioxide, ozone, oxygen, oxygen ion or oxygen radical. Nitrogen dioxide is particularly preferred for the strong oxidation power.

In the present invention, the pressure used during film formation can be appropriately selected so as to match the film formation method employed. In the above-mentioned methods (a) and (b), the total pressure during film formation is preferred to be set at 1 Pa or less. Use of such a low pressure enables formation of a film of high orientation at a low temperature. The pressure is also preferred to be $1 \times 10^{-1}$ Pa or higher from the standpoint of film formation rate, etc. It was found out that when the pressure is in the above range, eve if the temperature is 450° C. or lower, almost 100% of the PZT formed is orientated in a direction of (100). This film formation temperature is lower by about 150° C. or more than the film formation temperature used in conventional methods.

Next, description is made on a different aspect of the present invention. This semiconductor device has a crystallization-assisting conductive film made of a material capable of catalyzing, in formation of a metal oxide dielectric film, the formation of active precursors of the metal oxide dielectric film, so as to cover at least 10% of the area of the semiconductor device. A large area of the crystallization-assisting conductive film can stabilize the partial pressure of raw material gases in film formation chamber.

In order to obtain a film of good reproducibility in CVD, it is necessary to keep the partial pressure of raw material gases in film formation chamber, at a constant level. When nuclei are generated on lower electrodes, the partial pressure of raw material gases in film formation chamber is determined by the amount of raw material gases fed into the film formation chamber via a mass controller, the amount of gases discharged by a pump, and the amount of gases consumed for film formation on a substrate. The decomposition efficiency of raw material gases differs greatly on lower electrodes and on an insulating film such as silicon oxide film or the like. Therefore, when lower electrodes are produced first and the areal ratio of lower electrodes and silicon oxide film on a substrate changes greatly, the partial pressure of raw material gases in film formation chamber changes greatly as well, making it impossible to obtain a film with good reproducibility.

In producing actual electronic devices, film formation is made on lower electrodes of various patterns. A change in this pattern invites a change in areal ratio of lower electrodes and insulating film (e.g. silicon oxide film) and, consequently, a change in partial pressure of raw material gases.

When, as in the present invention, the crystallization-assisting conductive film made of a material capable of catalyzing the formation of active precursors of metal oxide dielectric film, similar to lower electrodes, is formed in a large area, the change of the areal ratio of lower electrodes makes substantially no change of the area ratio of lower electrode material (lower electrodes+crystallization-assisting conductive film) on wafer. As a result, the partial pressure of raw material gases in film formation chamber is stable independently of the pattern of device and a film of good reproducibility can be obtained.

In general, the area of capacitor element array is about 1/10 to 1/1,000 of the semiconductor device cut out as chip; and the area has recently become about 1/1,000 in many cases because the device has become finer. Therefore, by making the area of the crystallization-assisting conductive film 10% or more of the area of the semiconductor device, film formation can be stabilized. Stabilization of film formation is more striking as the area of the crystallization-assisting conductive film is larger. Hence, the area of the crystallization-assisting conductive film is preferably 20% or more, particularly preferably 40% or more, further preferably 60% or more of the area of the semiconductor device.

In the semiconductor device of the above mode, the shape of the crystallization-assisting conductive film may be any shape. The lower electrodes and the crystallization-assisting conductive film may often be formed on a surface of the same height, but may be formed on surfaces of different heights as long as they are exposed right before the formation of metal oxide dielectric film. The examples of the crystallization-assisting conductive film include such patterns as area of crystallization-assisting conductive films shown in FIGS. 1 to 6 is enlarged or such patterns as the number of repetition of crystallization-assisting conductive films shown in FIGS. 1 to 6 is enlarged. Using such patterns, both good crystallization and good film stabilization can be obtained.

In this aspect of the present invention, the material for crystallization-assisting conductive film, the method for formation of the film, etc. are completely the same as in the aspect wherein a crystallization-assisting conductive film is formed, for improved crystallization of metal oxide dielectric film, at a distance of not larger than the diffusion distance of active precursor, from the outermost lower electrodes of array region.

The crystallization-assisting conductive film may be allowed to have a particular electric potential. For example, when the crystallization-assisting conductive film is grounded, the reading error caused by an external noise appearing in high-speed driving of electronic device can be reduced. This is presumed to be because the electric field generating in lower-level wiring is shielded by the grounded crystallization-assisting conductive film and hardly affects the capacitor elements.

For such purpose, the crystallization-assisting conductive film is preferred to have an area as large as possible.

The present invention is described more specifically below by showing Examples.

Apparatus for Film Formation

Figure 7:
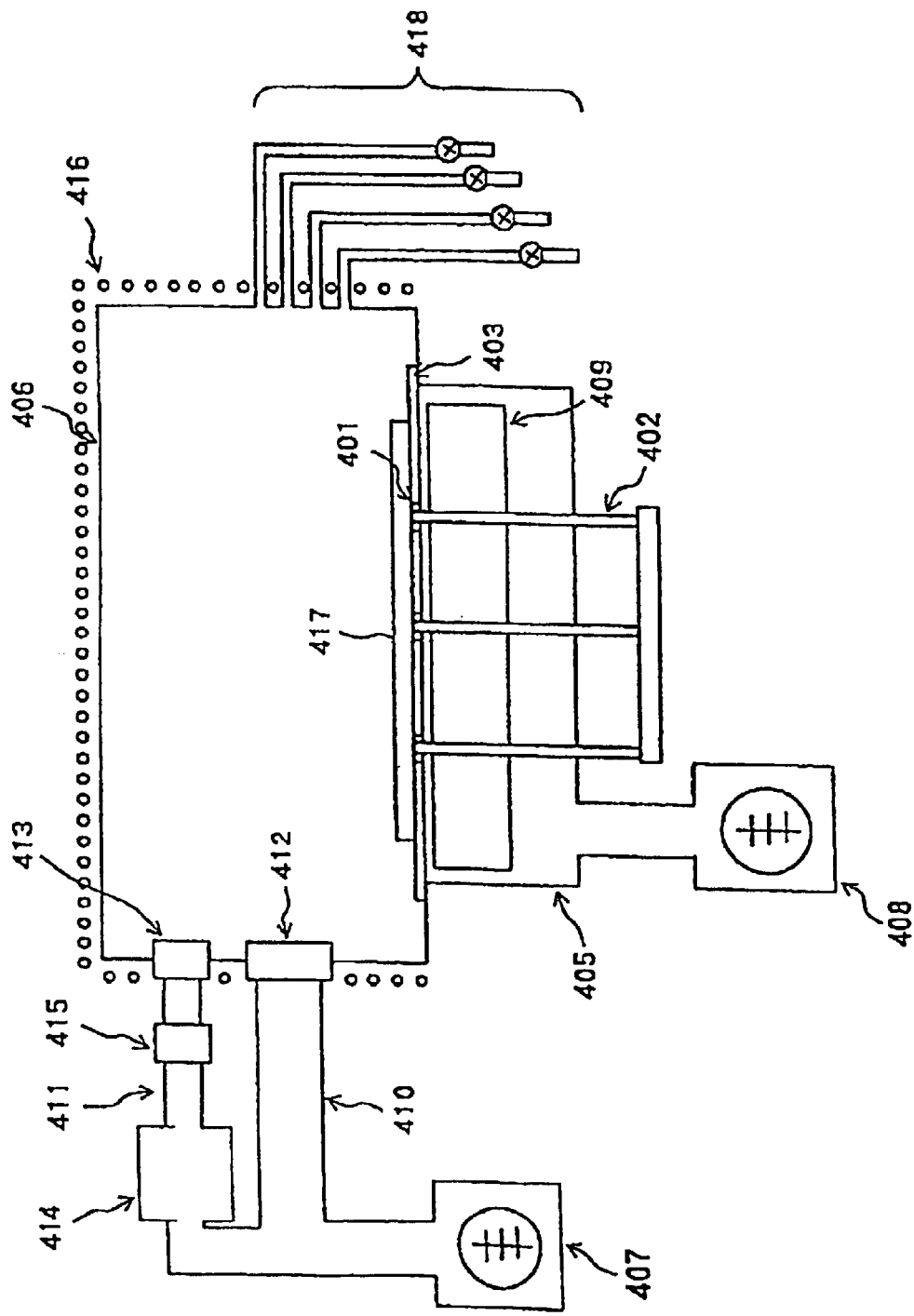
FIG. 7 is a schemtic view showing a section of the vacuum chamlber of the thin film chemical vapor deposition apparatus used in the present invention.

An example of the thin film CVD apparatus used in the present invention is shown in a schematic view of FIG. 7. This apparatus has a swapping chamber, a vacuum chamber and a raw materials-feeding system, and the swapping chamber can accommodate a plurality of 8-inch wafers.

The material for the vacuum chamber 406 is preferably a material of good thermal conductivity. For example, aluminum or stainless steel can be used as the material; however, aluminum of good thermal conductivity is particularly preferred. The vacuum chamber can be heated to a desired temperature by a heater 416 which is a wall-heating means. The inner wall of the vacuum chamber can be heated uniformly by producing the vacuum chamber using a material of good thermal conductivity.

A wafer 417 is placed on a quartz-made susceptor 403 with the side of wafer on which a device is to be produced, directed upward. The quartz-made susceptor 403 has three holes 401 of 5 mm in diameter. Quartz-made pins 402 make a vertical movement through the holes to transfer the wafer from a transfer apparatus onto the susceptor 403. After the wafer has been transferred onto the quartz-made susceptor, the pin holes are blocked by the wafer. In a state that the wafer is placed on the quartz-made susceptor, a heater chamber 405 below the wafer and the vacuum chamber 406 (into which raw material gases are to be introduced) are separated from each other.

The inner wall of the vacuum chamber 406 can be set, by the heater 416 (a wall-heating means), at a temperature which is not lower than the temperature at which organometal material gases have a sufficient vapor pressure but not higher than the decomposition temperature of the material gases. Since organometal material gases comprise a plurality of raw materials, some kinds or all kinds of the material gases are liquefied or solidified, or adhered onto the wafer in a non-equilibrium state, or the organometal gases are decomposed; as a result, the organometal material gases acting on the wafer cause a compositional change and the crystals formed give rise to a structural change. This phenomenon can be prevented by setting the temperature of the inner wall as above. Also by this temperature setting, the organometal material gases or decomposition products thereof hardly adhere to the inner wall and their peeling from the inner wall (this generates particles) can be prevented. Hence, it is preferred that the inner wall of the vacuum chamber 406 is set at a temperature which is not lower than the temperature at which the organometal material gases cause no condensation on the inner wall and have a sufficient release (release from the inner wall) speed and which is not higher than the decomposition temperature of the organometal material gases.

In the apparatus shown in FIG. 7, the vacuum chamber has two exhaust gas lines, i.e. a main exhaust gas line 410 and a subsidiary exhaust gas line 411. The main exhaust gas line is connected to a turbopump 407 via a main gate valve 412. The subsidiary exhaust gas line 411 is connected to the turbopump 407 via a valve 413 and through a water cooling type trap 414. During film formation, the main gate valve 412 is closed, the valve 413 is opened, and discharging of exhaust gas is conducted through the subsidiary exhaust gas line 411. By using such a constitution, the solidification or liquefaction of organometal material gases in the turbopump 407 can be prevented. As a result, the life of the turbopump 407 can be extended. By introducing a conductance-controllable valve 415 between the subsidiary exhaust gas line 411 and the water cooling type trap 414 and controlling the conductance, it is possible to change the total pressure of film-forming gases in the vacuum chamber. When no organometal material gases are not passed, the speed of exhaust gas can be increased and a higher vacuum can be obtained by also opening the main gate valve 412. Thereby, the partial pressure of the organometal material gases in the vacuum chamber can be decreased sharply. The main gate valve 412 and the valve 413 are embedded in the inner wall of the vacuum chamber 406 and can be heated uniformly.

Figure 8:
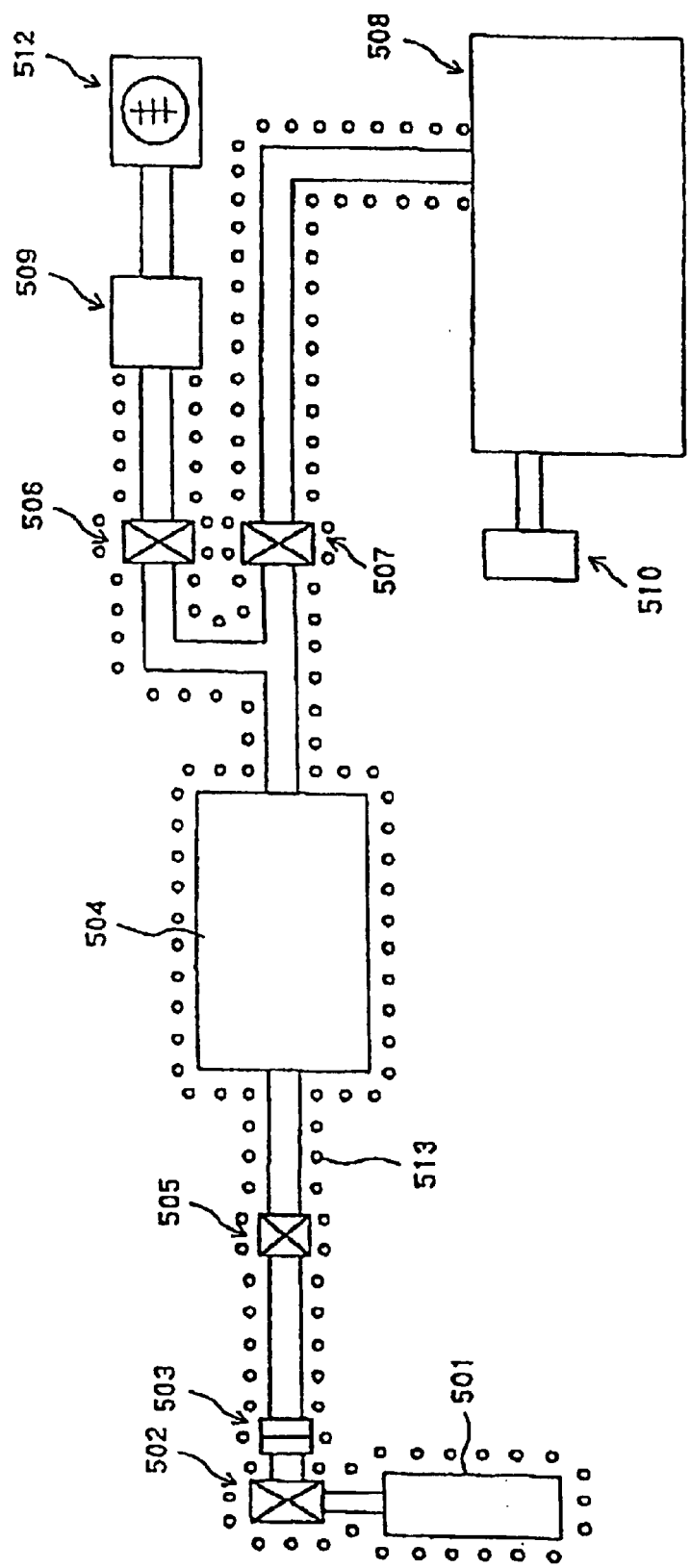
FIG. 8 is a schematic view showing the materials-feeding system of the thin film chemical vapor deposition apparatus used in the present invention.

FIG. 8 shows a schematic view of part of a raw materials-feeding system. Each organometal material gas is a liquid or a solid at room temperature and is stored in a cylinder 501. A valve 502 is provided at the top of the cylinder 501, and the valve 502 can be separated from a flange 503 for change of the kind of raw material gas.

A pipe extending from the cylinder 501 is connected to a mass flow controller 504 via a stop valve 505 and then is divided into two lines; one line is connected to a vacuum chamber 508 via a stop valve 506 and the other line is connected to a pump 512 via a stop valve 507 and a water cooling type trap 509. The portions of the raw materials-feeding system (e.g. pipes, mass flow controller 504 and valves 502, 505, 506 and 507), making contact with each organometal material gas are provided with a heating means 513, whereby each organometal material gas can be set, in order to prevent the liquefaction or solidification, at a temperature which is not lower than the temperature at which the material gas has a sufficient vapor pressure and not higher than the decomposition temperature of the material gas. In the CVD apparatus used in the present invention, the flow amount of each material gas can be controlled by the mass flow controller. The mass flow controller is used because the control of the flow amount of material gas per se (no carrier gas is used) is preferred. However, the control of the flow amount of material gas is not restricted to that using the mass flow controller.

During film formation, first, the valves 502, 505 and 506 are opened, the mass flow controller 504 is driven by the own pressure of the organometal material gas in the cylinder 501, the material gas is discharged into the pump 512, and thereby the flow amount of the material gas in the mass flow controller 504 is stabilized. Then, the valve 506 is closed and the valve 507 is opened, whereby the organometal material gas is fed into the vacuum chamber in a precisely controlled flow amount. Individual organometal material gases and an oxidizing gas are introduced into the vacuum chamber through respective pipes 418 (see FIG. 7) and are mixed in the vacuum chamber for the first time. That is, the oxidizing gas and each organometal material gas do not make contact with each other before they are introduced into the vacuum chamber.

By using the above-mentioned apparatus, it is possible to introduce, into the vacuum chamber, only the organometal material gases and oxidizing gas necessary for film formation, whereby the film formation conditions of the present invention can be realized easily.

In the CVD on capacitor electrodes using organometal material gases, nitrogen dioxide can be used as the oxidizing gas. Nitrogen dioxide is passed through a pipe for oxidizing gas.

The total pressure in the vacuum chamber during film formation can be set at 1 Pa or less by controlling the exhaust gas amount from the subsidiary exhaust gas line 411 of FIG. 7 and the flow amount of each mass flow controller 504 of FIG. 8.

The mode for carrying out the method for film formation according to the present invention is described in a case of forming a PZT film. In forming a PZT film, the representative materials, material temperatures and mass flow controller temperatures are as follows. The material for Pb is lead bisdipivaloylmethanate [Pb (DPM)$_2$], its temperature is 177° C., and the mass flow controller temperature thereof is 200° C.; the material for Zr is tetratertiarybutoxyzirconium [Zr(OtBu)$_4$], its temperature is 70° C., and the mass flow controller temperature thereof is 150° C.; the material for Ti is tetraisopropoxytitanium [Ti(OiPr)$_4$], its temperature is 75° C., and the mass flow controller temperature thereof is 150° C.; the mass flow controller temperature of NO$_2$ is 150° C.; and the inner wall temperature of the vacuum chamber is 180° C.

Film Formation Test 1

In this test, a pattern of lower electrodes shown in FIG. 1 was used. On a silicon oxide film was formed an array of lower electrodes, having a square area of 0.4 mm×0.4 mm. Each lower electrode was made of Pt and had a square size of 2 μm×2 μm, the electrode-to-electrode distance was 2 μm, and the array contained 100×100 such lower electrodes. Beneath each isolated lower electrode was a W-made plug, and an Al wiring was beneath the plug, whereby the measurement of electrical properties of each capacitor was possible. Such an array was arranged on each square chip of 4 mm×4 mm, and a number of such chips were formed on the whole surface of a 6-inch wafer.

There were prepared two kinds of substrates, that is, a substrate shown in FIG. 1, having Pt only at each lower electrode array area and a substrate shown in FIG. 2, wherein a crystallization-assisting conductive film 304 of large area, made of Pt is formed at the circumference of each lower electrode array at a distance of 2 μm from the outermost lower electrodes (therefore, the area of chip surface other than the array area was covered with Pt). A PZt film was formed on each of the two substrates; then, upper electrodes were formed thereon to complete capacitor elements; and the capacitor elements on two substrates were measured for electrical properties for comparison.

Crystal nuclei of lead titanate were formed in an islands state under the first film formation conditions which were 430° C., 40 seconds, lead bisdipivaloylmethanate [Pb(DPM)$_2$] of 0.2 SCCM, titanium isopropoxide [Ti(OiPr)$_4$] of 0.25 SCCM and NO$_2$ of 3.0 SCCM. Then, crystal growth was allowed to take place under the second film formation conditions which were 430° C., 1,200 seconds, lead bisdipivaloylmethanate [Pb(DPM)$_2$] of 0.25 SCCM, zirconium butoxide [Zr(OtBu)$_4$] of 0.225 SCCM, titanium isopropoxide [Ti(OiPr)$_4$] of 0.2 SCCM and NO$_2$ of 3.0 SCCM. Thereby, a PZT film was formed in a thickness of 200 nm. During the film formation, the total gas pressure in the vacuum chamber was 5×10$^{-1}$ Pa. The above film formation conditions are such that if Pt is formed on the whole surface of a 6-inch wafer, good PZT crystals can be formed thereon and accordingly a good hysteresis property can be obtained. Incidentally, the formation of lead titanate crystal nuclei under the first film formation conditions may be conducted not in an islands state but until a nuclei layer is formed.

Figure 9B:
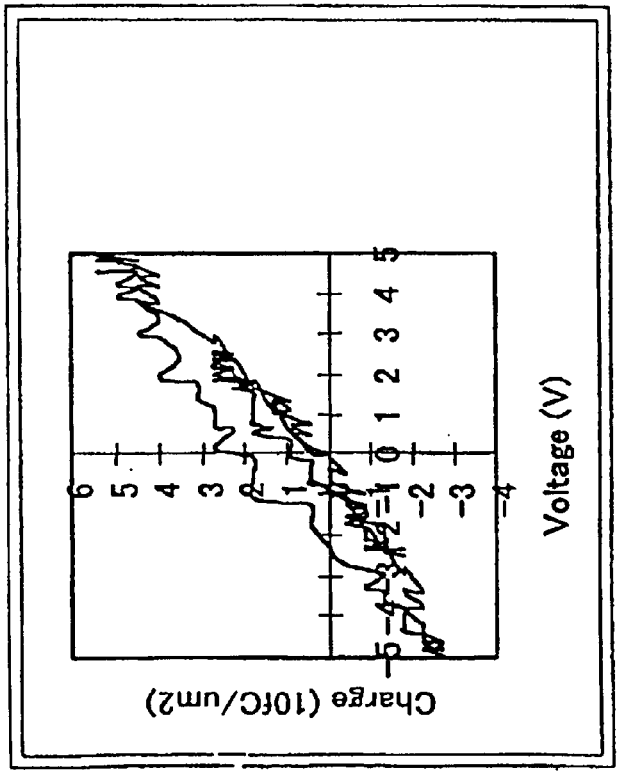
FIGS. 9(A) and 9(B) are graphs showing the hystereses of a capacitor element having a crystallization-assisting conductive film and a capacitor element having no such film.
Figure 9A:
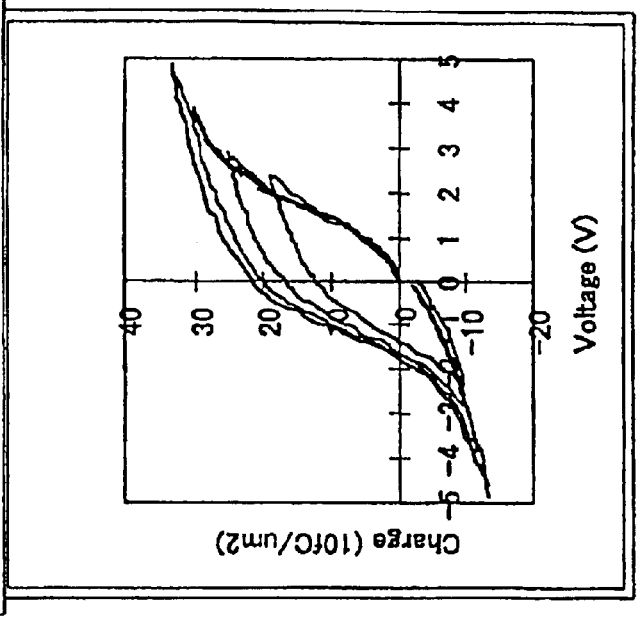

In FIG. 9 are shown the results comparing the hysteresis properties of square capacitors (2 μm×2 μm). In the case of the substrate having Pt also on the whole area other than the array area, a good hysteresis property is obtained and good PZT crystals are formed on each fine (2 μm×2 μm) Pt lower electrode, as shown in FIG. 9(b). On the other hand, in the case of the substrate having Pt only on the array area, no hysteresis property is obtained and no PZT crystals are formed, as shown in FIG. 9(a).

That is, no crystallization of PZT takes place on fine electrodes, in the conventional method; meanwhile, in the present invention, crystals of dielectric film can be formed on lower electrodes finely separated from each other, under the same film formation conditions as used for a wafer having a lower electrode material on the whole surface, and good electrical properties can be obtained.

In actual electronic devices, holes for contact to lower-level wirings are necessary. Therefore, the portion of the crystallization-assisting conductive film, corresponding to such holes are removed beforehand, in some cases. Hence, 100 square holes of 2 μm×2 μm were randomly made in the lower electrode material formed on the chip surface area other than the array area, to expose the silicon oxide film on the surface; and the same test was conducted. As a result, a good hysteresis property was obtained on 2 μm×2 μm square lower electrodes similarly to the case when no holes were made in the above-mentioned lower electrode material.

Therefore, the important thing is that a crystallization-assisting conductive film made of the same material as that of lower electrodes is formed on the surface area of chip, surrounding a lower electrode array area.

Accordingly, even if the conductive film has fine holes reaching the chip surface (silicon oxide), crystals of dielectric film can be formed on the fine lower electrodes separated from each other and good electrical properties can be obtained.

Film Formation Test 2

Next, a change in hysteresis property was examined when the square size of each lower electrode made of Pt was varied in 0.5 $\mu$m×0.5 $\mu$m, 1 $\mu$m×1 $\mu$m, 2 $\mu$m×2 $\mu$m, 5 $\mu$m×5 $\mu$m, 10 $\mu$m×10 $\mu$m, 50 $\mu$m×50 $\mu$m and 100 $\mu$m×100 $\mu$m. The distance between adjacent two lower electrodes was constant at 2 $\mu$m, and the square size of lower electrode array as whole was also constant at 0.4 mm×0.4 mm. As in the film formation test 1, one capacitor array was formed in one 4 mm×4 mm chip; such chips were formed on the whole surface of a 6-inch wafer; and the properties of individual capacitors could be measured. Other conditions were the same as in the film formation test 1, whereby a PZT film was formed in a thickness of 200 nm.

Figure 10:
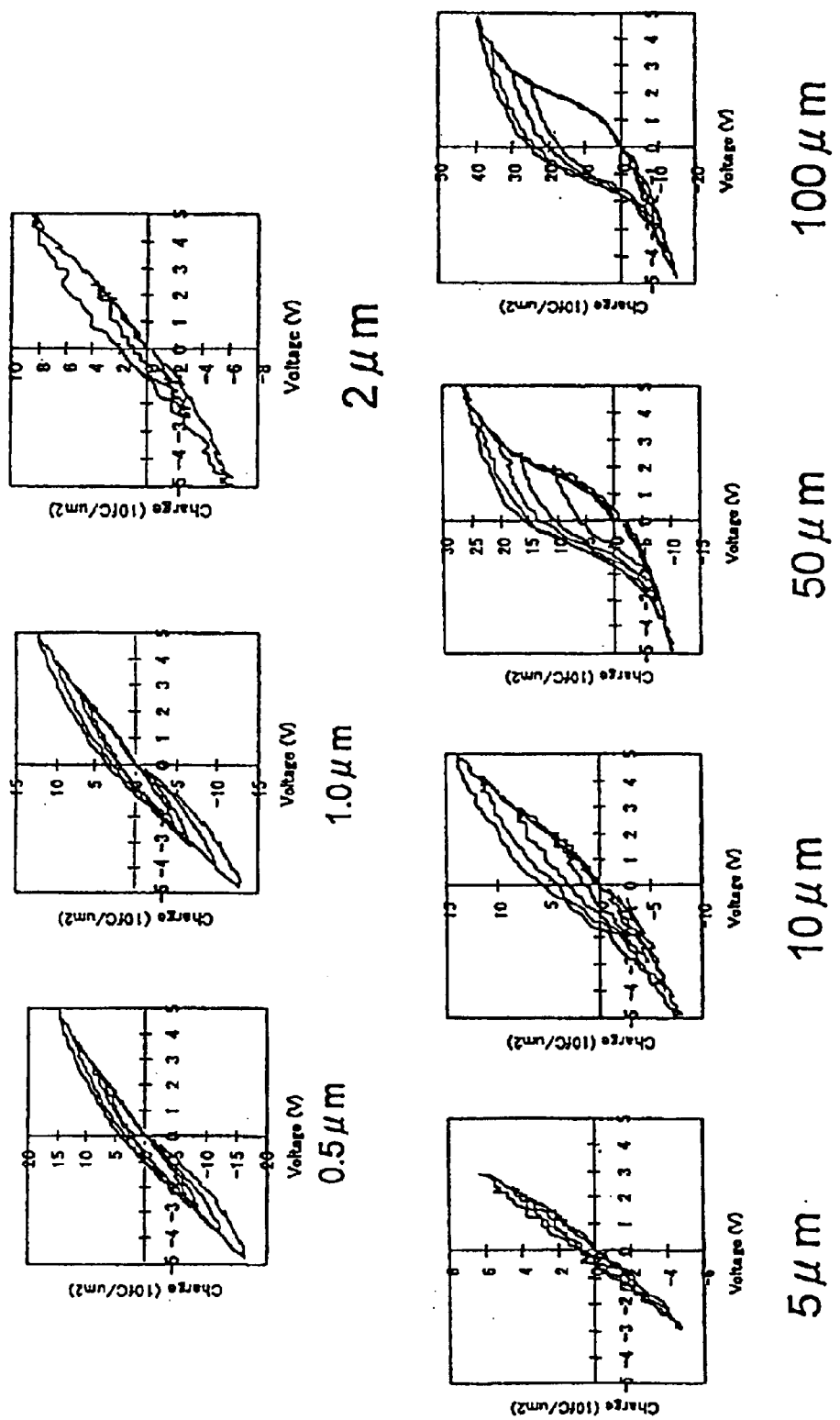
FIG. 10 is a series of graphs showing the hystereses of capacitor elements using no crystallization-assisting conductive film.
Figure 11:
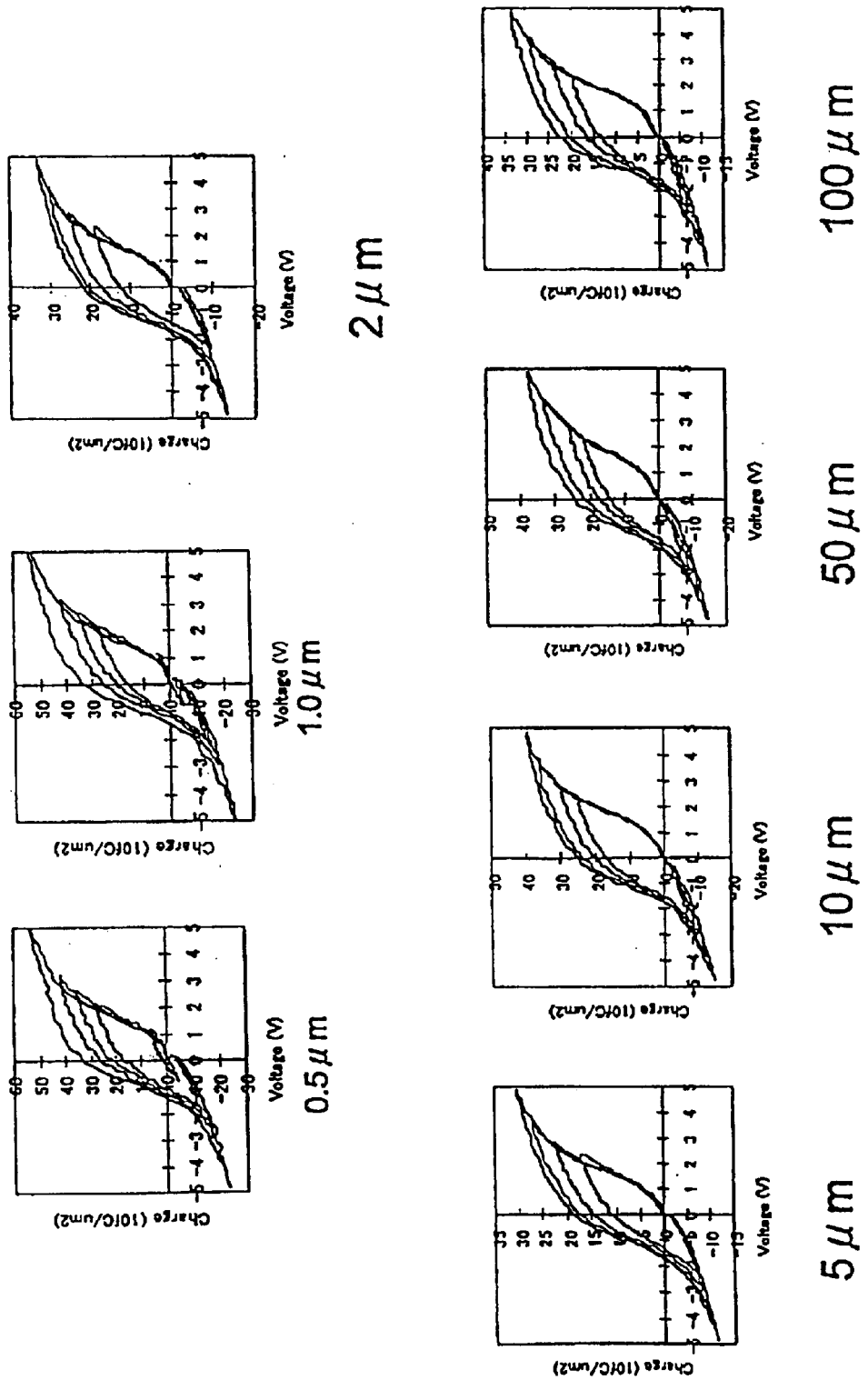
FIG. 11 is a series of graphs showing the hystereses of capacitor elements using a crystallization-assisting conductive film.

FIG. 10 shows the hysteresis properties of capacitors when only the lower electrodes of array area were formed with Pt, and FIG. 11 shows the hysteresis properties of capacitors when a Pt-made crystallization-assisting conductive film was formed on the surface area of chip other than the lower electrode array area.

As is clear from the result of FIG. 11, when the crystallization-assisting conductive film was formed, good hysteresis was obtained even when the lower electrodes were as small as 0.5 $\mu$m×0.5 $\mu$m, and the hysteresis was not dependent upon the pattern of lower electrode array. Meanwhile, as is clear from the result of FIG. 10, when Pt was used for formation of lower electrodes alone, hysteresis was obtained when the lower electrode size was 50 $\mu$m×50 $\mu$m or larger; however, when the lower electrode size was 10 $\mu$m×10 $\mu$m or smaller, good hysteresis property was not obtained and the hysteresis was largely dependent upon the pattern of lower electrode array.

Next, the PZTs formed on 2 $\mu$m×2 $\mu$m lower electrodes and 100 $\mu$m×100 mm: lower electrodes were measured for composition by an EDX method (energy dispersive X-ray spectroscopy). When a Pt-made crystallization-assisting conductive film was formed on a substrate, the PZTs formed on 2 $\mu$m×2 $\mu$m lower electrodes and 100 $\mu$m×100 mm lower electrodes had each a desired stoichiometric composition. However, when no Pt-made crystallization-assisting conductive film was formed on a substrate, the PZT formed on 100 $\mu$m×100 $\mu$m lower electrodes had a desired stoichiometric composition but the PZT formed on 2 $\mu$m×2 $\mu$m lower electrodes was short in Pb. Therefore, when PZT is formed on Pt, the Pb content in the PZT formed on fine lower electrodes can be made sufficient by allowing the most area of chip surface other than lower electrode array area to be covered with Pt.

Film Formation Test 3

In this film formation test, a lower electrode array of 0.4 mm×0.4 mm and a Pt-made crystallization-assisting conductive film of 2 mm in width, surrounding the array, were formed at the center of a 6-inch wafer, as shown in FIG. 2 or 3. The separation width (q) between adjacent two lower electrodes within the array was equal to the distance (d) between the outermost lower electrodes and the Pt-made crystallization-assisting conductive film. By changing the distance d (=q), a change in the hysteresis of capacitor element was examined. The size of lower electrode was constant at 2 $\mu$m×2 $\mu$m. The other conditions were the same as in the film formation test 1, and a PZT film was formed in a thickness of 200 nm.

Figure 12:
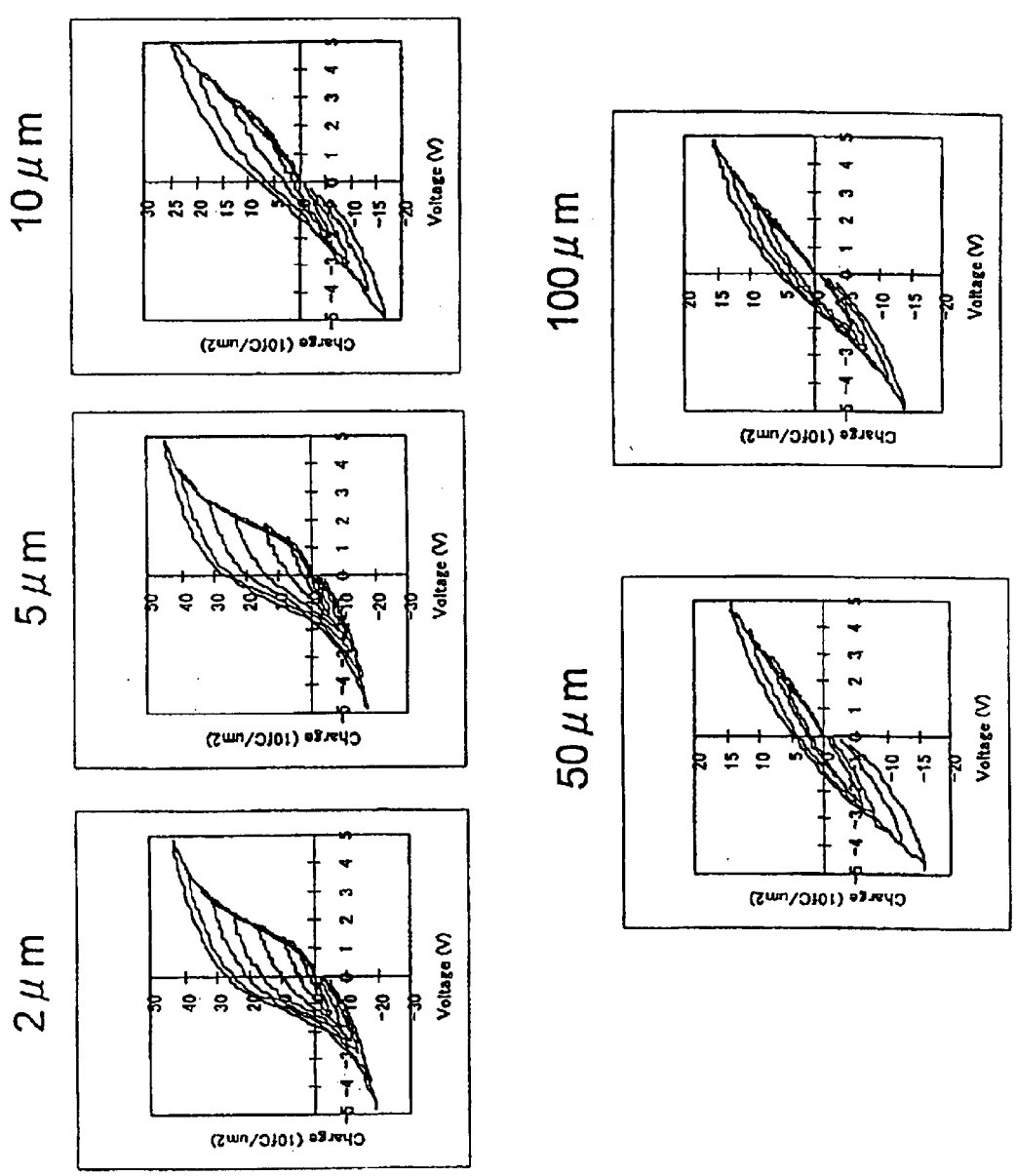
FIG. 12 is a series of graphs showing the change in hysteresis of capacitor element when the separation width between adjacent two lower electrodes and the distance between outermost lower electrode and crystallization-assisting conductive film have been changed.

In FIG. 12 are shown the hystereses for various distances d. As is clear from the result of FIG. 12, no good hysteresis is obtained under the above film formation conditions when the distance d is 10 $\mu$m or larger. The active precursors formed by the decomposition of material gases on Pt can diffuse onto Pt lower electrodes finely separated from each other, but the active precursors are considered to have a small adhesion coefficient on the silicon oxide film area (i.e. the distance d (or q)area) and cause re-vaporization. It is presumed that when the film formation temperature is 430° C., the distance d at which the active precursors can diffuse and spread without causing re-vaporization is smaller than 10 $\mu$m; and that at a distance d equal to or larger than 10 $\mu$m, the active precursors are unable to sufficiently reach the Pt lower electrodes finely separated from each other, the resulting dielectric film has no desired stoichiometric composition, and no crystallization takes place. Thus, the maximum value of separation d at which active precursor can difuse varies depending upon the temperature of wafer and tends to be smaller when the wafer temperature is higher. This is presumed to be because the re-vaporization of active precursors on oxide film is promoted at a higher temperature.

EXAMPLE 1 FOR DEVICE PRODUCTION

Figure 13A:
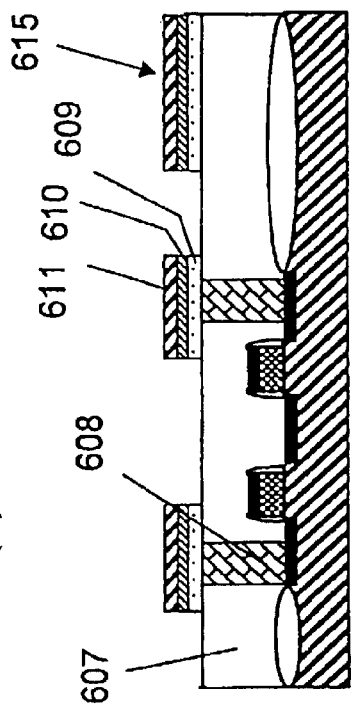
FIGS. 13(A)–(D) are schematic views showing the steps of Example 1 for device production.

Example 1 for device production is described with reference to FIGS. 13(A)–(D). First, an oxide film 606 for element isolation was formed on a silicon substrate 600 by wet oxidation, to isolate element regions. Then, the ion of an impurity such as boron, phosphorus or the like was injected to form n type and p type wells. Thereafter, gates and diffusion layers were formed as follows. First, a gate oxide film 601 was formed by wet oxidation, and then a polysilicon film 602 to become gates was formed, followed by etching. A silicon oxide film was formed on the polysilicon, followed by etching-back to form side wall oxide films 603. Then, the ion of an impurity such as boron, arsenic or the like was injected to form n type and p type diffusion layers 605. Thereon was formed a Ti film; the film was reacted with silicon; unreacted Ti was removed by etching; thereby, the surfaces of the gates 604 and diffusion layers 605 were converted to Ti silicide. By the above steps, there were formed, on the silicon substrate, n type and p type MOS transistors isolated by the oxide film 606, as shown in FIG. 13(A).

Figure 13B:
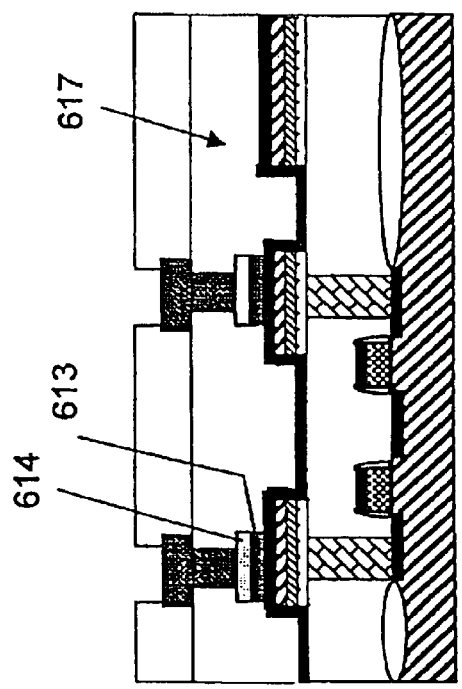

Next, contacts and lower electrodes were formed as shown in FIG. 13(B). First, there was formed, as a first inter-layer insulating film 607, a silicon oxide film or an impurity (e.g. boron)-containing silicon oxide film (BPSG). Then, the film was flattened by CMP. Thereafter, contacts (holes) were formed by etching. Then, an impurity was injected into the n type and p type diffusion layers, followed by a heat treatment at 750° C. for 10 seconds. Thereafter, a Ti film and a TiN film each as barrier metal were formed.

Thereon was formed a tungsten film by CVD. The film was subjected to CMP to form tungsten plugs 608. The tungsten plugs may also be formed by CVD and subsequent etching-back. Thereon were formed a Ti film 609 and a TiN film 610 continuously by sputtering, and a Pt film 611 having a thickness of 100 nm was formed thereon, whereby a Pt/TiN/Ti lower electrode material film was formed. The Pt film is preferably formed by sputtering at a high temperature of about 300° C.

Then, dry etching was conducted. Thereby, lower electrodes separated from each other (that is, a lower electrode array) were formed and, simultaneously therewith, a crystallization-assisting conductive film 615 was formed by removing the portions of the lower electrode material film (Pt/TiN/Ti film) corresponding to the holes for connection to lower-level wirings and the portions of the lower electrode material film to be removed for the structural reason of device and leaving the other portion of the lower electrode material film on the wafer. The pattern of the lower electrode array formed was such that each lower electrode had a size of 1 μm×1 μm, the distance between adjacent two lower electrodes was 1.5 μm, and the array had a size of 250 μm×250 μm and contained 100×100 lower electrodes. The crystallization-assisting conductive film surrounded the array area, as shown in FIG. 2 and the distance between outermost lower electrodes and crystallization-assisting conductive film was 2 μm.

Figure 13C:
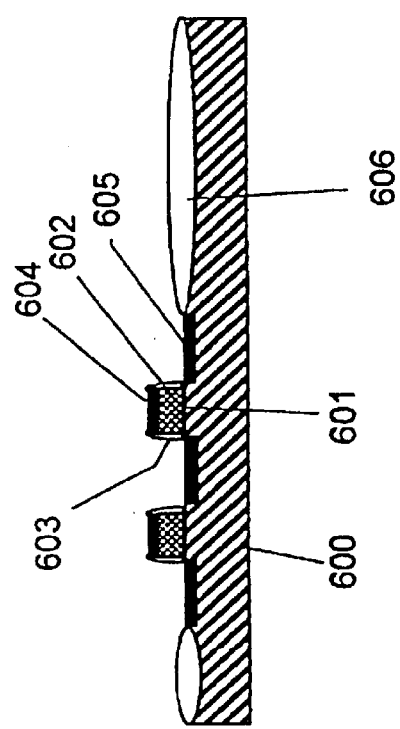

Then, as shown in FIG. 13(c), a PZT film 612 was formed in a thickness of 200 nm. The conditions for formation of this PZT film were the same as in the film formation test 1.

Figure 13D:
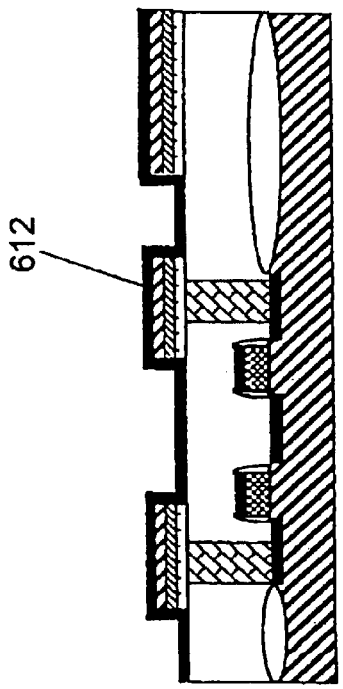

Then, as shown in FIG. 13(D), an $IrO_2$ film 613 and an Ir film 614 were formed in this order by sputtering, followed by dry etching to form capacitor lower electrode layers and plate wirings connected thereto, to complete capacitor elements each having a capacitive insulating film made of PZT. Thereon were formed, as a passivation film 617, a silicon oxide film and a, SION film. Thereafter, holes for wiring pad were made to enable evaluation of electrical properties.

In order to evaluate the electrical properties of the above-completed capacitors, 5,000 square PZT capacitors of 1 μm×1 μm were connected in parallel and measured for properties. As a result, a value of 10 $\mu C/cm^2$ or more was obtained as a difference between inversion charge and non-inversion charge, which was a good dielectric property. The fatigue property and the holding property were also good. Further, the property in transistor of gate length=0.26 μm was evaluated. As a result, the variation of threshold voltage Vt in each of p type transistor and n type transistor was good at 10% or less on the whole surface of wafer. Furthermore, the resistance of square contact of 0.4 μm×0.4 μm beneath capacitor was measured using contact chain method. As a result, the resistance was good at 10 Ωm or less per one contact. Moreover, the resistance to noise was high. Moreover, by employing the above-mentioned steps, each upper electrode can also be used as a plate wiring; therefore, there is no need of forming plate wirings separately, the production cost can be reduced, and the deterioration of. dielectric film caused during plate wiring formation can be minmized.

EXAMPLE 2 FOR DEVICE PRODUCTION

Figure 14A:
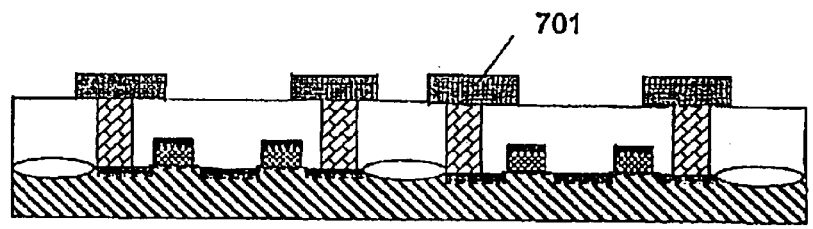
FIGS. 14(A)–(C) are schematic views showing the steps of Example 2 for device production.

Example 2 for device production is described with reference to FIGS. 14(A)–(C). The steps up to the formation of tungsten plugs were conducted in the same manner as in Example 1. Thereon were formed a Ti film and a TiN film. Then, an AlCu film was formed by sputtering, followed by dry etching to form first aluminum wirings 701, whereby was formed a structure shown in FIG. 14(A), wherein first aluminum wirings were on n type and p type MOS transistors.

Figure 14B:
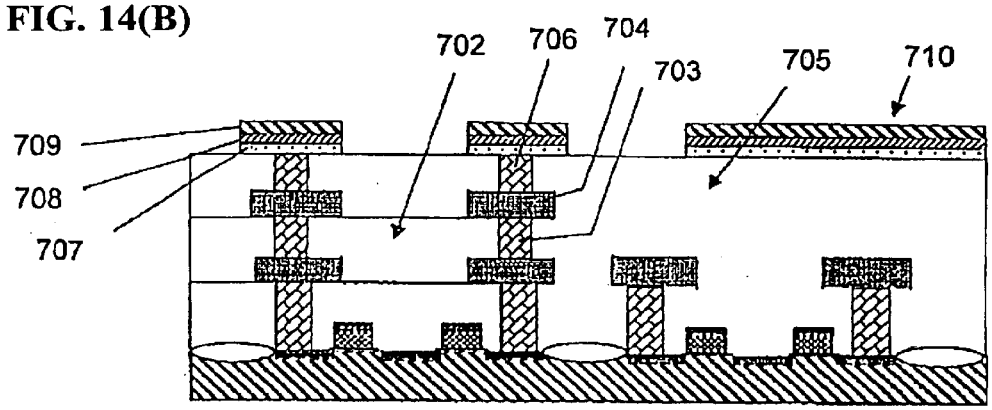

Then, via holes and second aluminum wirings were formed as shown in FIG. 14(B). First, there was formed, as a second inter-layer insulating film 702, a silicon oxide film or an impurity (e.g. boron)-containing siliconoxide film (BPSG), and the film was flattened by CMP.

Then, via holes were made by etching, after which a Ti film and a TiN film both as barrier metal were formed. Thereon was formed a tungsten film by CVD, followed by CMP to form tungsten plugs 703. The tungsten plugs may be formed by CVD and subsequent etching-back. Thereon were formed a Ti film and a TiN film by sputtering, after which a copper-containing aluminum film was formed by sputtering. Then, dry etching was conducted to form second aluminum wirings 704. Thereon was formed, as a third inter-layer insulating film 705, a silicon oxide film or an impurity (e.g. boron)-containing s licon oxide film (BPSG), and the film was flattened by CMP. Then, via holes were made by etching, and a Ti film and a TiN film both as barrier metal were formed. A tungsten film was formed thereon by CVD, and the film was subjected to CMP to form tungsten plugs 706. The tungsten plugs may be formed by CVD and subsequent etching-back.

By repeating the formation of the aluminum wirings, inter-layer insulating film and vias, a desired number of wring layers can be formed. On the last tungsten plugs were formed a Ti film 707 and a TiN film 708 by continuous sputtering. Thereon was formed a Pt film 709 of 100 nm. The Pt film is preferably formed by sputtering at a high temperature of about 300° C.

Next, in the same manner as in Example 1, dry etching was conducted. Thereby, lower electrodes separated from each other (that is, a lower electrode array) were formed and, simultaneously therewith, a crystallization-assisting conductive film 710 was formed by removing the portions of the lower electrode material film (Pt/TiN/Ti film) corresponding to the holes for connection to lower-level wirings and the portions of the lower electrode material film to be removed for the structural reason of device and leaving the other portion of the lower electrode material film on the wafer. The patterns of the lower electrode array and the crystallization-assisting conductive film were the same as in Example 1.

Figure 14C:
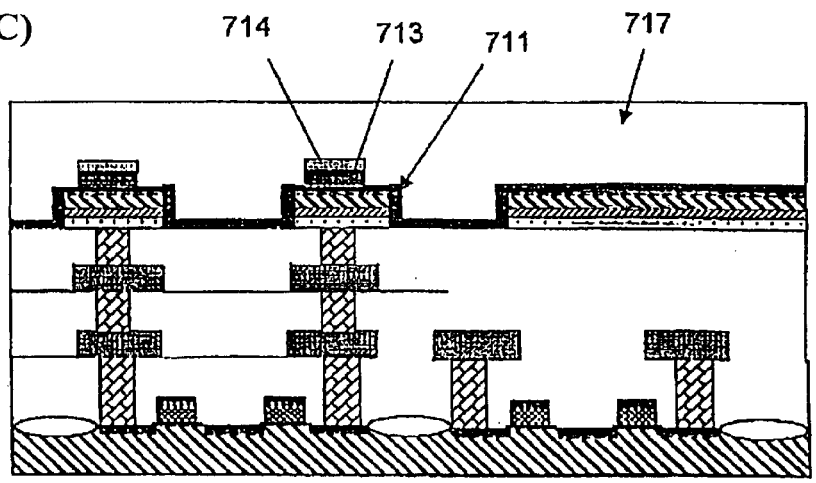

Then, as shown in FIG. 14(C), a PZT film 711 was formed on the whole surface in a thickness of 200 nm under the same conditions as in Example 1. Then, an $IrO_2$ film 713 and an Ir film 714 were formed by sputtering. Successively, dry etching was conducted to form upper electrode layers and plate wirings connected thereto, to complete capacitor elements having a PZT capacitive insulating film. Thereon were formed, as a passivation film 717, a silicon oxide film and a SiON film. Then, holes for wiring pad were made to enable evaluation of electrical properties.

The thus-produced capacitors were evaluated in the same manner as in Example 1. As a result, a value of 10 $\mu C/cm^2$ or more was obtained as the difference between inversion charge and non-inversion charge, which was a good dielectric property. The fatigue property and the holding property were also good. Further, the property in transistor of gate length=0.26 μm was evaluated. As a result, the variation of threshold voltage Vt in each of p type transistor and n type transistor was good at 10% or less on the whole surface of wafer. Furthermore, the resistance of square contact of 0.4 μm×0.4 μm beneath capacitor was measured using contact chain method. As a result, the resistance was good at 10 Ωcm or less per one contact. Moreover, the resistance to noise was high.

EXAMPLE 3 FOR DEVICE PRODUCTION

In this Example, copper wirings were used as the lower-level wirings. Description is made with reference to FIGS.

Figure 15A:
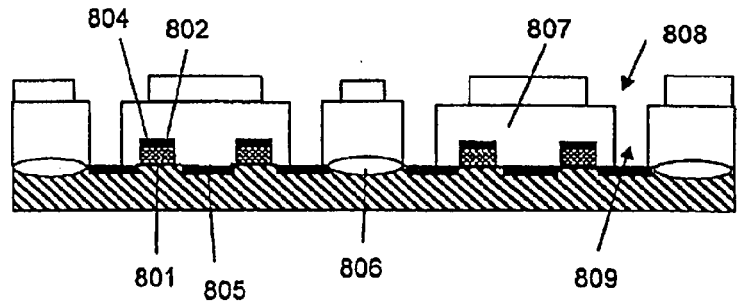
FIGS. 15(A)–(C) are schematic views showing the steps of Example 3 for device production.

15(A)–(C). First, an oxide film 806 for element isolation was formed on a silicon substrate by wet oxidation. Then, the ion of an impurity such as boron, phosphorus or the like was injected to form n type and p type wells. Thereafter, gates and diffusion layers were formed as follows. As shown in FIG. 15(A), first, a gate oxide film 801 was formed by wet oxidation, and then a polysilicon film 802 to become gates was formed, followed by etching. A silicon oxide film was formed on the polysilicon, followed by etching-back to form side wall oxide films (not shown). Then, the ion of an impurity such as boron, arsenic or the like was injected to form n type and p type diffusion layers. Thereon was formed a Ti film; the film was reacted with silicon; unreacted Ti was removed by etching; thereby, Ti silicide was formed at the surfaces of gates 804 and diffusion layers 805. By the above steps, there were formed, on the silicon substrate, n type and p type MOS transistors isolated by the oxide film 806.

On the thus-formed structure was formed, as a first inter-layer insulating film 807, a silicon oxide film of an impurity (e.g. born)-containing silicon oxide film (BPSG). The film was flattened by CMP. Then, etching was conducted to form wiring grooves 808 and contact holes 809. Thereafter, an impurity was injected into the n type and p type diffusion layers from the holes, followed by a heat treatment at 750° C. for 10 seconds. By the steps up to this point, a structure of FIG. 15(A) was formed.

Figure 15B:
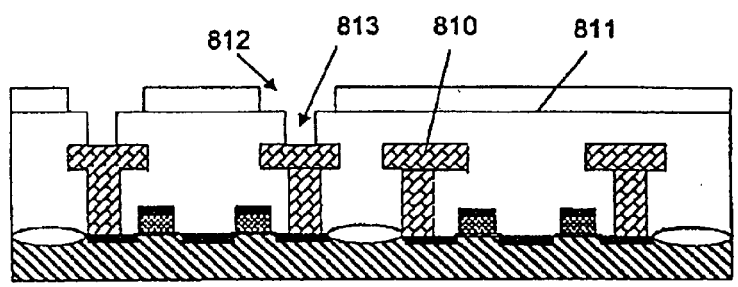

Then, as shown in FIG. 15(B), a Ta film as barrier metal was formed. Thereon was formed a Cu film by sputtering. Using the film as a seed layer, plating was conducted to fill Cu in the contacts and the wiring grooves. CMP was conducted to form Cu wirings 810 separated from each other. Thereon were formed, as a second inter-layer insulating film 811, a silicon oxide film and, as an etching stopper film for CMP, a silicon nitride film. Then, etching was conducted to form wiring grooves 812 and through-holes 813.

Figure 15C:
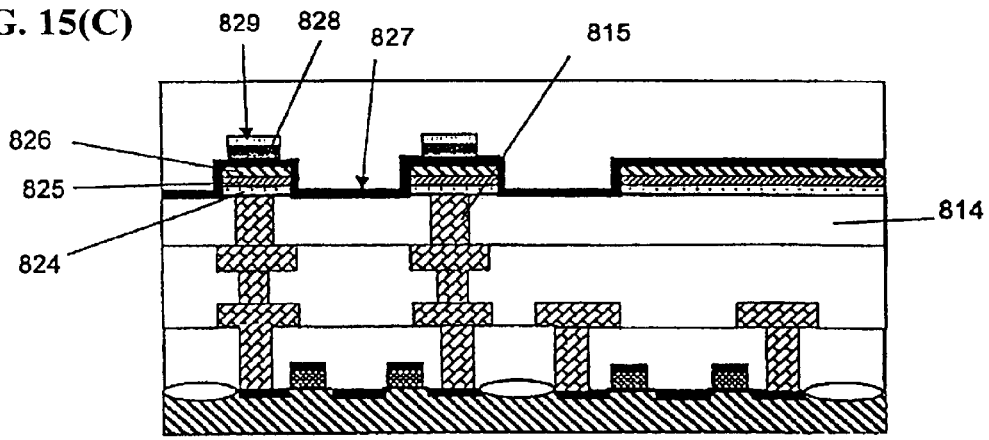

Then, as shown in FIG. 15(C), a Ta film as barrier metal was formed. Thereon was formed a Cu film by sputtering. Using the film as a seed layer, plating was conducted to fill Cu in the contacts and the wiring grooves. CMP was conducted to form wirings separated from each other. By repeating this dual damascene process, a desired number of wiring layers can be formed. Thereon were formed, as a third inter-layer insulating film 814, a silicon oxide film and, as an etching stopper film for CMP, a silicon nitride film. Then, etching was conducted to form through-holes. Then, a Ta film as barrier metal was formed. Thereon was formed a Cu film by sputtering. Using the film as a seed layer, plating was conducted to fill Cu in the through-holes. CMP was conducted to form plugs 815 separated from each other. Tungsten may be used for formation of the plugs 815. In formation of tungsten plugs, CVD is used in place of plating, to fill the through-holes. Also, TiN/Ti is used as the barrier metal.

On the last plugs were formed a Ti film 824 and a TiN film 825 by sputtering. Thereon was formed a Pt film 826 of 100 nm. The Pt film is preferably formed by sputtering at a high temperature of about 300° C.

Next, in the same manner as in Example 1, dry etching was conducted. Thereby, lower electrodes separated from each other (that is, a lower electrode array) were formed and, simultaneously therewith, a crystallization-assisting conductive film 710 was formed by removing the portions of the lower electrode material film (Pt/TiN/Ti film) corresponding to the holes for connection to lower-level wirings and the portions of the lower electrode material film to be removed for the structural reason of device and leaving the other portion of the lower electrode material film on the wafer. The patterns of the lower electrode array and the crystallization-assisting conductive film were the same as in Example 1.

Then, a PZT film 827 was formed on the whole surface in a thickness of 200 nm under the same conditions as in Example 1. Then, an $IrO_2$ film 828 and an Ir film 829 were formed by sputtering. Dry etching was conducted to form upper electrode layers and plate wirings connected thereto, to complete capacitor elements having a PZT capacitive insulating film. Thereon were formed, as a passivation film 830, a silicon oxide film and a SiON film. Then, holes for wiring pad were made to enable evaluation of electrical properties.

The thus-produced capacitors were evaluated in the same manner as in Example 1. As a result, a value of 10 $\mu C/cm^2$ or more was obtained as the difference between inversion charge and non-inversion charge, which was a good dielectric property. The fatigue property and the holding property were also good. Further, the property in transistor of gate length=0.26 $\mu$m was evaluated. As a result, the variation of threshold voltage Vt in each of p type transistor and n type transistor was good at 10% or less on the whole surface of wafer. Furthermore, the resistance of square contact of 0.4 $\mu$m×0.4 $\mu$m beneath capacitor was measured using contact chain method. As a result, the resistance was good at 10 $\Omega$cm or less per one contact. Moreover, the resistance to noise was high.

Tungsten or copper contacts were used in the above Examples 1 to 3 for device production. Polysilicon contacts were also used and good results were obtained in ferroelectric capacitor property, transistor property and contact resistance.

Effects of the Invention

The present invention can provide a semiconductor device having capacitor elements which are superior in properties and reliability even when the capacitor elements are produced in a fine structure.

The present invention can also provide a semiconductor device having capacitor elements superior in noise resistance.

The present invention can also provide a process for producing, at a high productivity, a semiconductor device having capacitor elements which are superior in properties and reliability even when the capacitor elements are produced in a fine structure, by reliably conducting the crystallization of the metal oxide dielectric film of capacitor particularly into a perovskite type crystal at a low temperature.

The present invention can also provide a process for producing a semiconductor device having capacitor elements superior in noise resistance.

What is claimed is:

1. A process for producing a semiconductor device comprising an array of a plurality of capacitor elements which are each a laminate of a lower electrode, a metal oxide dielectric film of a perovskite type crystal represented by $ABO_3$, and an upper electrode in this order on a semiconductor substrate; the process comprising steps of:

forming the lower electrodes and a crystallization-assisting conductive film on an insulating film; said films being independently made, wherein the crystallization-assisting conductive film is made of a material capable of catalyzing formation of active precursors of the metal oxide dielectric film in the formation of the metal oxide dielectric film; the crystallization-assisting conductive film being formed outside the capacitor array area at a distance not larger than the diffusion distance of active precursor from the outermost lower electrodes of the array, in a width of 20 µm or more and at least equal to the width enabling formation of the crystal nuclei of the metal oxide dielectric film; and forming the metal oxide dielectric film on the formed lower electrodes and the formed crystallization-assisting conductive film.

2. A process for producing a semiconductor device according to claim 1, wherein the crystallization-assisting conductive film is formed at a distance of less than 10 µm from the outermost lower electrodes of the capacitor array area.

3. A process for producing a semiconductor device comprising an array of a plurality of capacitor elements which are each a laminate of a lower electrode, a metal oxide dielectric film of a perovskite type crystal represented by $ABO_3$ and an upper electrode in this order on a semiconductor substrate; the process comprising a step of:

a) forming, on an insulating film on which the lower electrodes are to be formed, a crystallization-assisting conductive film so as to cover at least 10% of the area of the semiconductor device; the crystallization-assisting conductive film being made of a material capable of catalyzing the formation of active precursors of the metal oxide dielectric film in formation of the metal oxide dielectric film;

b) forming patterned lower electrodes, simultaneously or independently with the formation of the crystallization-assisting conductive film;

c) forming a continuous layer of metal oxide dieleotric film over the patterned lower electrode;

d) forming a continuous layer of upper electrodes on the continuous layer of metal oxide dielectric film; and e) patterning the continuous layer of upper electrodes in the form of upper electrodes without patterning the continuous layer of the metal oxide dielectric film corresponding to each upper electrode.

4. A process for producing a semiconductor device according to claim 1, wherein the lower electrodes and the crystallization-assisting conductive film independently comprise a surface layer consisting of a conductive material selected from the group consisting of Pt, Ir, Ru, $IrO_2$ and $RuO_2$.

5. A process for producing a semiconductor device according to claim 3, wherein the lower electrodes and the crystallization-assisting conductive film independently comprise a surface layer consisting of a conductive material selected from the group consisting of Pt, Ir, Ru, $IrO_2$ and $RuO_2$.

6. A process for producing a semiconductor device according to claim 1, wherein one conductive material is used for formation of the crystallization-assisting conductive film and the lower electrodes, a film of the conductive material is formed on the insulating film, and the film is etched to simultaneously form the lower electrodes and the crystallinity-assisting conductive film in respective patterns.

7. A process for producing a semiconductor device according to claim 3, wherein one conductive material is used for formation of the crystallization-assisting conductive film and the lower electrodes, a film of the conductive material is formed on the insulating film, and the film is etched to simultaneously form the lower electrodes and the crystallinity-assisting conductive film in respective patterns.

8. A process for producing a semiconductor device according to claim 1, wherein the metal oxide dielectric film of a perovskite type crystal represented by $ABO_3$ contains Pb as the element A.

9. A process for producing a semiconductor device according to claim 3, wherein the metal oxide dielectric film of a perovskite type crystal represented by $ABO_3$ contains Pb as the element A.

10. A process for producing a semiconductor device according to claim 8, wherein the metal oxide dielectric film is a PZT film.

11. A process for producing a semiconductor device according to claim 9, wherein the metal oxide dielectric film is a PZT film.

12. A process for producing a semiconductor device according to claim 1, wherein the formation of the metal oxide dielectric film is conducted under first conditions which are initial conditions and then under second conditions which are subsequent conditions and the two conditions are different from each other.

13. A process for producing a semiconductor device according to claim 3, wherein the formation of the metal oxide dielectric film is conducted under first conditions which are initial conditions and then under second conditions which are subsequent conditions and the two conditions are different from each other.

14. A process for producing a semiconductor device according to claim 12, wherein, under the first conditions for film formation, various organometal material gases that are precursors of the metal oxide dielectric film are used, and initial nuclei or an initial layer, both of a perovskite type crystal structure, are formed on the lower electrodes and the crystallization-assisting conductive film and, under the second conditions for film formation, the perovskite type crystal structure is allowed to grow on the initial nuclei or initial layer.

15. A process for producing a semiconductor device according to claim 13, wherein, under the first conditions for film formation, all kinds of the organometal material gases to become a material of the metal oxide dielectric film are used and initial nuclei or an initial layer, both of a perovskite type crystal structure, is formed on the lower electrodes and the crystallization-assisting conductive film and, under the second conditions for film formation, the perovskite type crystal structure is allowed to grow on the initial nuclei or initial layer.

16. A process for producing a semiconductor device according to claim 12, wherein, under the first conditions for film formation, only selected organometal material gases that are precursors of the metal oxide dielectric film are used, and initial nuclei or an initial layer, both of a perovskite type crystal structure are formed on the conductive material and, under the second conditions for film formation, the perovskite type crystal structure is allowed to grow on the initial nuclei or initial layer.

17. A process for producing a semiconductor device according to claim 13, wherein, under the first conditions for film formation, only some kinds of the organometal material gases to become a material of the metal oxide dielectric film are used and initial nuclei or an initial layer, both of a perovskite type crystal structure is formed on the conductive material and, under the second conditions for film formation, the perovskite type crystal structure is allowed to grow on the initial nuclei or initial layer.

18. A process for producing a semiconductor device according to claim 14, wherein, under the second conditions for film formation, the feeding condition of raw material gases is set to that which enables self-controlling film formation and, under the first conditions for film formation, the raw material gas for the element A is fed in a larger amount than under the second conditions for film formation.

19. A process for producing a semiconductor device according to claim 15, wherein, under the second conditions for film formation, the feeding condition of raw material gases is set to that which enables self-controlling film formation and, under the first conditions for film formation, the raw material gas for the element A is fed in a larger amount than under the second conditions for film formation.

20. A process for producing a semiconductor device according to claim 16, wherein, under the second conditions for film formation, the feeding condition of raw material gases is set to that which enables self-controlling film formation and, under the first conditions for film formation, the raw material gas for the element A is fed in a larger amount than under the second conditions for film formation.

21. A process for producing a semiconductor device according to claim 17, wherein, under the second conditions for film formation, the feeding condition of raw material gases is set to that which enables self-controlling film formation and, under the first conditions for film formation, the raw material gas for the element A is fed in a larger amount than under the second conditions for film formation.

22. A process for producing a semiconductor device according to claim 14, wherein, when the element B contains Zr and Ti, the amount of the fed raw material gas for Zr, relative to the amount of the fed raw material gas for Ti is smaller under the first conditions for film formation than under the second conditions for film formation.

23. A process for producing a semiconductor device according to claim 15, wherein, when the element B contains Zr and Ti, the amount of the fed raw material gas for Zr, relative to the amount of the fed raw material gas for Ti is smaller under the first conditions for film formation than under the second conditions for film formation.

24. A process for producing a semiconductor device according to claim 16, wherein, when the element B contains Zr and Ti, the amount of the fed raw material gas for Zr, relative to the amount of the fed raw material gas for Ti is smaller under the first conditions for film formation than under the second conditions for film formation.

25. A process for producing a semiconductor device according to claim 17, wherein, when the element B contains Zr and Ti, the amount of the fed raw material gas for Zr, relative to the amount of the fed raw material gas for Ti is smaller under the first conditions for film formation than under the second conditions for film formation.

26. A process for producing a semiconductor device according to claim 14, wherein, when the element B contains Zr and another element, no raw material gas for Zr is fed under the first conditions for film formation.

27. A process producing a semiconductor device according to claim 15, wherein, when the element B contains Zr and other element, no raw material gas for Zr is fed under the first conditions for film formation.

28. A process for producing a semiconductor device according to claim 16, wherein, when the element B contains Zr and another element, no raw material gas for Zr is fed under the first conditions for film formation.

29. A process producing a semiconductor device according to claim 17, wherein, when the element B contains Zr and other element, no raw material gas for Zr is fed under the first conditions for film formation.

30. A process for producing a semiconductor device according to claim 14, wherein the diameters of the crystal grains obtained during film formation are controlled by controlling the time of the first conditions for formation of initial nuclei or initial layer.

31. A process for producing a semiconductor device according to claim 15, wherein the diameters of the crystal grains obtained during film formation are controlled by controlling the time of the first conditions for formation of initial nuclei or initial layer.

32. A process for producing a semiconductor device according to claim 16, wherein the diameters of the crystal grains obtained during film formation are controlled by controlling the time of the first conditions for formation of initial nuclei or initial layer.

33. A process for producing a semiconductor device according to claim 17, wherein the diameters of the crystal grains obtained during film formation are controlled by controlling the time of the first conditions for formation of initial nuclei or initial layer.

34. A process for producing a semiconductor device according to claim 12, wherein a total pressure of a raw material gas mixture including organometal gases is kept at 1 Pa or less during the film formation.

35. A process four producing a semiconductor device according to claim 13, wherein a total pressure of a raw material gas mixture including organometal gases is kept at 1 Pa or less during the film formation.

36. A process producing a semiconductor device according to claim 34, wherein the film formation is conducted at 450° C. or less.

37. A process for producing a semiconductor device according to claim 35, wherein the film formation is conducted at 450° C. or less.

38. A process for producing a semiconductor device comprising an array of a plurality of capacitor elements which are each a laminate of a lower electrode, a metal oxide dielectric film of a perovskite type crystal represented by $ABO_3$ and an upper electrode in this order on a semiconductor substrate, the process comprising steps of:
  a) forming patterned lower electrodes and a crystallization-assisting conductive film on an insulating film; said lower eleotrides and said crystallization assisting condiontive film being independently made, wherein the crystallization-assisting conductive film is made of a material capable of catalyzing formation of active precursors of the metal oxide dielectric film in the formation of the metal oxide dielectric film; the crystallization-assisting conductive film being formed outside the capacitor array area at a distance not larger than the diffusion distance of active precursor from the outermost lower electrodes of the array, in a width at least equal to the width enabling formation of the crystal nuclei of the metal oxide dielectric film;
  b) forming a continuous layer of the metal oxide dielectric film on the patterned lower electrodes and the formed crystallization-assisting conductive film;
  c) forming a continuous layer of upper electrodes over the continuous layer of metal oxide dielectric film; and
  d) patterning the continuous layer of upper electrodes in the form of upper electrodes without patterning the continuous layer of the metal oxide dielectric film corresponding to each upper electrode.

39. A process for producing a semiconductor device according to claim 38, wherein the crystallization-assisting conductive film is formed at a distance of less than 10 $\mu$m from the outermost lower electrodes of the capacitor array area.

40. A process for producing a semiconductor device according to claim 38, wherein the crystallization-assisting conductive film is formed outside the array area in a width of 20 μm or more.

41. A process for producing a semiconductor device according to claim 39, wherein the crystallization-assisting conductive film is formed outside the array area in a width of 20 μm or more.

42. A process for producing a semiconductor device according to claim 38, wherein the lower electrodes and the crystallization-assisting conductive film independently comprise a surface layer consisting of a conductive material selected from the group consisting of Pt, Ir, Ru, $IrO_2$ and $RuO_2$.

43. A process for producing a semiconductor device according to claim 38, wherein one conductive material is used for formation of the crystallization-assisting conductive film and the lower electrodes, a film of the conductive material is formed on the insulating film, and the film is etched to simultaneously form the lower electrodes and the crystallization-assisting conductive film in respective patterns.

44. A process for producing a semiconductor device according to claim 38, wherein the metal oxide dielectric film of a perovskite type crystal represented by $ABO_3$ contains Pb as the element A.

45. A process for producing a semiconductor device according to claim 44, wherein the metal oxide dielectric film is a PZT film.

46. A process for producing a semiconductor device according to claim 38, wherein the formation of the metal oxide dielectric film is conducted under first conditions which are initial conditions and then under second conditions which are subsequent conditions and the two conditions are different from each other.

47. A process for producing a semiconductor device according to claim 46, wherein, under the first conditions for film formation, various organometal material gases that are precursors of the metal oxide dielectric film are used, and initial nuclei or an initial layer, both of a perovskite type crystal structure, are formed on the lower electrodes and the crystallization-assisting conductive film, and, under the second conditions for film formation, the perovskite type crystal structure is allowed to grow on the initial nuclei or initial layer.

48. A process for producing a semiconductor device according to claim 46, wherein, under the first conditions for film formation, only selected organometal material gases that are precursors of the metal oxide dielectric film are used, and initial nuclei or an initial layer, both of a perovskite type crystal structure are formed on the conductive material and, under the second conditions for film formation, the perovskite type crystal structure is allowed to grow on the initial nuclei or initial layer.

49. A process for producing a semiconductor device according to claim 47, wherein, under the second conditions for film formation, the feeding condition of raw material gases is set to that which enables self-controlling film formation and, under the first conditions for film formation, the raw material gas for the element A is fed in a larger amount than under the second conditions for film formation.

50. A process for producing a semiconductor device according to claim 48, wherein, under the second conditions for film formation, the feeding condition of raw material gases is set to that which enables self-controlling film formation and, under the first conditions for film formation, the raw material gas for the element A is fed in a larger amount than under the second conditions for film formation.

51. A process for producing a semiconductor device according to claim 47, wherein, when the element B contains Zr and Ti, the amount of the fed raw material gas for Zr, relative to the amount of the fed raw material gas for Ti is smaller under the first conditions for film formation than under the second conditions for film formation.

52. A process for producing a semiconductor device according to claim 48, wherein, when the element B contains Zr and Ti, the amount of the fed raw material gas for Zr, relative to the amount of the fed raw material gas for Ti is smaller under the first conditions for film formation than under the second conditions for film formation.

53. A process for producing a semiconductor device according to claim 47, wherein, when the element B contains Zr and another element, no raw material gas for Zr is fed under the first conditions for film formation.

54. A process for producing a semiconductor device according to claim 48, wherein, when the element B contains Zr and another element, no raw material gas for Zr is fed under the first conditions for film formation.

55. A process for producing a semiconductor device according to claim 47, wherein the diameters of the crystal grains obtained during film formation are controlled by controlling the time of the first conditions for formation of initial nuclei or initial layer.

56. A process for producing a semiconductor device according to claim 48, wherein the diameters of the crystal grains obtained during film formation are controlled by controlling the time of the first conditions for formation of initial nuclei or initial layer.

57. A process for producing a semiconductor device according to claim 45, wherein a total pressure of a raw material gas mixture including organometal gases is kept at 1 Pa or less during the film formation.

58. A process for producing a semiconductor device according to claim 57, wherein the film formation is conducted at 450° C. or less.

59. The process for producing a semiconductor device according to claim 3, wherein the crystallization-assisting film being formed outside the lower electrodes has in a width at least equal to the width enabling formation of crystal nuclei of the metal oxide dielectric film.

* * * * *